United States Patent [19]

Springer et al.

[11] Patent Number: 4,902,786

[45] Date of Patent: Feb. 20, 1990

[54] PHENYLAZONAPHTHOL OR NAPHTHYLAZONAPHTHOL COMPOUNDS CONTAINING A FIBRE-REACTIVE AMINOPHENYLAMINO-SUBSTITUTED HALOGEN-S-TRIAZINYLAMINO GROUP AND A FIBRE-REACTIVE GROUP OF THE VINYLSULFONE SERIES, SUITABLE AS DYESTUFFS

[75] Inventors: Hartmut Springer, Königstein/Taunus; Michael Kunze; Marcos Segal, both of Hofheim am Taunus, all of Fed. Rep. of Germany

[73] Assignee: Hoechst Aktiengesellschaft, Frankfurt am Main, Fed. Rep. of Germany

[21] Appl. No.: 196,323

[22] Filed: May 20, 1988

Related U.S. Application Data

[63] Continuation of Ser. No. 913,534, Sep. 30, 1986, Pat. No. 4,757,136.

[30] Foreign Application Priority Data

Jul. 17, 1986 [DE] Fed. Rep. of Germany ....... 3624136
Sep. 30, 1986 [DE] Fed. Rep. of Germany ....... 3624781

[51] Int. Cl.$^4$ ............... C09B 62/085; C09B 62/45; C09B 62/51; D06P 1/384
[52] U.S. Cl. ............................. 534/638; 534/617; 534/642
[58] Field of Search ............... 534/638, 632, 635, 636, 534/637

[56] References Cited

U.S. PATENT DOCUMENTS

| | | | |
|---|---|---|---|
| 3,223,470 | 12/1965 | Boedeker et al. | 534/638 X |
| 4,341,699 | 7/1982 | Tezuka et al. | 534/638 |
| 4,378,313 | 3/1983 | Kayane et al. | 534/638 |
| 4,725,675 | 2/1988 | Meininger et al. | 534/638 |

FOREIGN PATENT DOCUMENTS

| | | | |
|---|---|---|---|
| 0036582 | 9/1981 | European Pat. Off. | 534/638 |
| 0111288 | 6/1984 | European Pat. Off. | 534/638 |
| 0111830 | 6/1984 | European Pat. Off. | 534/638 |
| 3245525 | 6/1984 | Fed. Rep. of Germany | 534/638 |
| 40-017113 | 8/1965 | Japan | 534/638 |
| 55-039672 | 10/1980 | Japan | 534/638 |
| 59-4653 | 1/1984 | Japan | 534/638 |
| 60-0163972 | 8/1985 | Japan | 534/638 |
| 2186585 | 8/1987 | United Kingdom | 534/638 |

OTHER PUBLICATIONS

T. Ikeda et al, Chem. Abs. 85: 95796f (1976), corresp. to JP 75 31566 (10–1975).

Primary Examiner—Floyd D. Higel

[57] ABSTRACT

Water-soluble azo compounds having fiber-reactive dye properties conforming to the formula

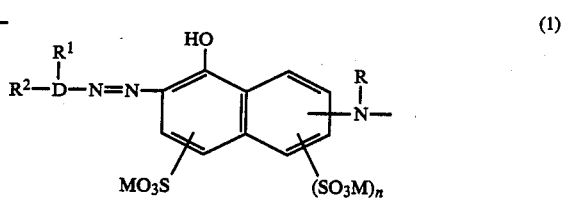

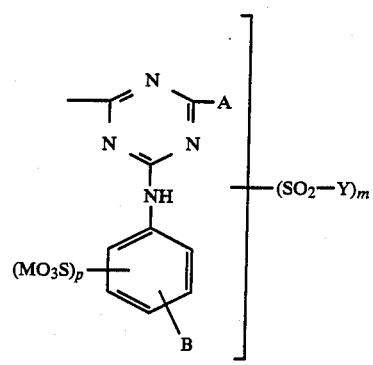

in which
D denotes a benzene or naphthalene ring;
$R^1$ denotes hydrogen, alkyl, alkoxy, sulfo or carboxy;
$R^2$ denotes hydrogen, alkyl, alkoxy, sulfo, carboxy, substituted or unsubstituted aryl, hydroxy, nitro or halogen;
R denotes hydrogen or substituted or unsubstituted alkyl;
A denotes hydroxy, substituted or unsubstituted alkoxy or aryloxy, thio, substituted or unsubstituted alkylthioether or arylthioether or an optionally monosubstituted or disubstituted amino group having substituents from the aliphatic and aromatic and the acylamide series;
B hydroxy, optionally substituted alkoxy or aryloxy, thio, optionally substituted alkylthioether or arylthioether or an optionally monosubstituted or disubstituted amino group having substituents from the aliphatic and aromatic and the acylamide series;
M denotes hydrogen, alkali or alkaline earth;
m denotes the number 1 or 2;
n denotes the number 0 or 1;
p denotes the number 0, 1 or 2;
y denotes β-thiosulfatoethyl, β-phosphatoethyl, β-chloroethyl, vinyl or β-sulfatoethyl;
the group —SO$_2$—Y is bonded to A or D or to both; or in which:
A is chlorine or bromine,
B is an optionally monosubstituted or disubstituted amino group having substituents from the aliphatic and aromatic and the acylamide series,
m denotes the number 1 and the group —SO$_2$Y is bonded to D and
D, $R^1$, $R^2$, R, M, n, p and Y have the above meanings.

The new azo compounds dye fiber materials, such as wool and in particular cellulose, in strong and fast shades.

6 Claims, No Drawings

PHENYLAZONAPHTHOL OR NAPHTHYLAZONAPHTHOL COMPOUNDS CONTAINING A FIBRE-REACTIVE AMINOPHENYLAMINO-SUBSTITUTED HALOGEN-S-TRIAZINYLAMINO GROUP AND A FIBRE-REACTIVE GROUP OF THE VINYLSULFONE SERIES, SUITABLE AS DYESTUFFS

The invention relates to the field of fiber-reactive azo dyes.

This is a continuation application of parent application Ser. No. 06/913,534, filed 9/30/86. The parent application has been allowed on January 28, 1988 and has issued as U.S. Pat. No. 4,757,136 issued to Springer et al.

Fiber-reactive dyes are used in a large volume for the dyeing and printing of textile fiber materials, and a large number of usable reactive dyes for various application areas are available. For instance, European Patent Application Publication No. 0,094,055, British Patent Application Publication No. 2,026,527 and Japanese Preliminary Published Applications sho-57-42,986, sho-58-46,185 and sho-58-46,186 describe azo dyes which contain a fiber-reactive radical from the vinylsulfonyl series and a further fiber-reactive radical from the monochloro- or monofluoro-triazinyl series. However, the current state of the art is not totally satisfactory. The known dyes have certain applications defects, such as, for example, insufficient suitability for certain dyeing methods, and in some instances not totally satisfactory fastness properties such as, for example, insufficient wet light and perspiration light fastness properties.

The present invention has for its object to find new water-soluble reactive dyes of improved properties, which shall be suitable in particular for the exhaust method and produce dyeings of a high fastness level. This object is achieved with the present invention.

The invention provides new, useful water-soluble azo compounds of the general formula (1)

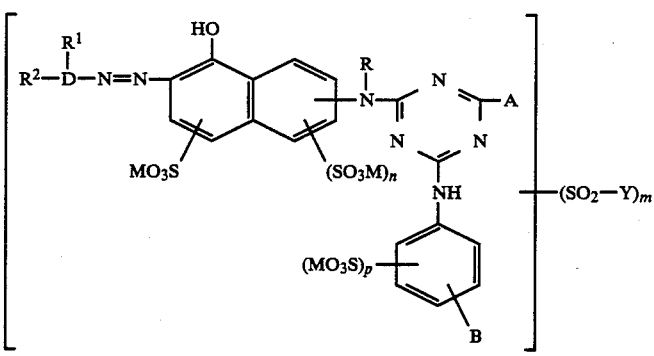

in which the meanings are:

D is a benzene ring or a naphthalene ring;

$R^1$ is a hydrogen atom, an alkyl group of 1 to 4 carbon atoms, an alkoxy group of 1 to 4 carbon atoms, a sulfo group or a carboxy group;

$R^2$ is a hydrogen atom, an alkyl group of 1 to 4 carbon atoms, an alkoxy group of 1 to 4 carbon atoms, a sulfo group, a carboxy group, an aryl radical which can be substituted, a hydroxy group, a nitro group or a halogen atom, such as a chlorine or bromine atom;

R is a hydrogen atom or an alkyl group of 1 to 4 carbon atoms which can be substituted;

A is a hydroxy group or a group of the formula (2a), (2b) or (2c)

$$-O-R^3, \quad (2a)$$

$$-S-R^3, \quad (2b)$$

 (2c)

in which $R^3$ is an alkyl group of 1 to 4 carbon atoms which can be substituted, or a substituted or unsubstituted aryl radical, $R^4$ is a hydrogen atom, a substituted or unsubstituted aliphatic radical or a substituted or unsubstituted aliphatic radical and $R^5$ denotes a hydrogen atom, a substituted or unsubstituted aliphatic radical, a substituted or unsubstituted aryl radical, the cyano group, a substituted or unsubstituted amino group or a group of the general formula (2d)

 (2d)

in which

Z stands for an oxygen atom, a sulfur atom or the imido group NH, or $R^4$ and $R^5$ together with the nitrogen atom and an alkylene group of 4 to 7 carbon atoms or with 1, 2 or 3 alkylene group(s) of 1 to 5 carbon atoms and 1 or 2 further hetero groups, such as NH or nitrogen, oxygen or sulfur atoms, form a 5- to 8-membered saturated heterocyclic ring, such as in particular the morpholine, piperidine or piperazine ring;

B is situated on the benzene nucleus in the ortho-, meta- or para-position relative to the amino group and is a radical of the general formula (2e), (2f) or (2g)

$$-O-R^6, \quad (2e)$$

$$-S-R^6, \quad (2f)$$

(2g)

in which
R⁶ is a hydrogen atom, an alkyl group of 1 to 4 carbon atoms which can be substituted, or a substituted or unsubstituted aryl radical,
R⁷ is a hydrogen atom, a substituted or unsubstituted aliphatic radical or a substituted or unsubstituted cycloaliphatic radical and
R⁸ denotes a hydrogen atom, a substituted or unsubstituted aliphatic radical, a substituted or unsubstituted aryl radical, the cyano group, a group of the abovementioned and defined general formula (2d), the amino group, an amino group which is mono-substituted or disubstituted by alkyl of 1 to 4 carbon atoms and/or substituted or unsubstituted aryl, or a group of the general formula (2h)

(2h)

in which
W is an alkyl group of 1 to 4 carbon atoms, which can be substituted, or an alkoxy group of 1 to 4 carbon atoms, which can be substituted, or an aryl radical which can be substituted,
or
R⁷ and R⁸ together with the nitrogen atom and an alkylene group of 4 to 7 carbon atoms or with 1, 2 or 3 alkylene group(s) of 1 to 5 carbon atoms and 1 or 2 further hetero groups, such as NH or nitrogen, oxygen or sulfur atoms, form a 5- to 8-membered saturated heterocyclic ring, such as, in particular, a morpholine, piperidine or piperazine ring;
M is a hydrogen atom or an alkali metal, such as sodium, potassium or lithium, or one equivalent of an alkaline earth metal, such as of calcium, but preferably a hydrogen atom or an alkali metal;
m stands for the number 1 or 2;
n stands for the number 0 or 1 (where in the case of n=0, this group denotes a hydrogen atom);
p stands for the number 0, 1 or 2 (where in the case of p=0, this group denotes a hydrogen atom);
Y is a β-thiosulfatoethyl, β-phosphatoethyl, β-chloroethyl or preferably the vinyl group or particularly preferably a β-sulfatoethyl group;
the —SO₂—Y group which is present once or twice in the compound of the formula (1) is bonded to the formula radical A or D or to both in any desired positions, it being possible for this group to be bonded to aliphatic and, preferably, aromatic carbon atoms of A and to aromatic carbon atoms of D or to aliphatic and, preferably, aromatic carbon atoms of R¹ and R².

When m stands for the number 2, the two —SO₂—Y groups are preferably not bonded simultaneously to A or D, but one to A and one to D.

The abovementioned and defined formula members can have meanings which are identical to or different from one another.

A sulfo group is a group of the general formula —SO₃M, a carboxy group is a group of the general formula —COOM, a thiosulfato group is a group of the general formula —S—SO₃M, a phosphato group is a group of the general formula —OPO₃M₂ and a sulfato group is a group of the general formula —OSO₃M, where in each case M has the abovementioned meaning.

The new azo compounds can be present in the acid form and in the form of their salts. They are preferred in the form of their salts, in particular the alkali metal salts, and are also preferably used in the form of these salts for dyeing (understood here and hereinafter in the general sense and as including printing) hydroxy- and/or carboxamido-containing materials, in particular fiber materials.

Alkyl groups of 1 to 4 carbon atoms are preferably the methyl and ethyl group; alkoxy groups of 1 to 4 carbon atoms are preferably the methoxy and ethoxy group.

Aliphatic radicals are preferably alkyl groups of 1 to 4 carbon atoms or alkenyl groups of 2 to 4 carbon atoms. When the alkyl groups are substituted, they are preferably substituted by 1 or 2, preferably 1, substituent which has been selected from the group consisting of alkoxy of 1 to 4 carbon atoms, sulfo, carboxy, hydroxy, sulfato or substituted or unsubstituted aryl; when the formula radical A contains a substituted alkyl group, one or both, preferably one, of these substituents can also be, in accordance with the above definition, the —SO₂—Y group mentioned.

When alkoxy groups are substituted, they are preferably substituted by a hydroxy group or an alkoxy group of 1 to 4 carbon atoms or an alkoxyalkoxy group of 1 to 4 carbon atoms in each of the alkyl radicals. Substituted or unsubstituted cycloaliphatic radicals are preferably 5- to 8-membered cycloalkyl radicals, such as the cyclopentyl or cyclohexyl radical, which can be substituted, for example by 1 to 3 methyl groups. Aryl radicals are preferably the phenyl radical or the 1- or 2-naphthyl radical. When the phenyl radical is substituted, it is preferably substituted by 1 or 2 substituents which have been selected from the group consisting of alkyl of 1 to 4 carbon atoms, alkoxy of 1 to 4 carbon atoms, hydroxy, nitro, carboxy, sulfo and chlorine; when the naphthyl radical is substituted, it is preferably substituted by 1, 2 or 3 sulfo groups. When the formula radicals R², R³, R⁴ and R⁵ denote substituted aryl radicals, 1 or 2, preferably 1, of the substituents can, in accordance with the above definition, be the —SO₂—Y group mentioned.

Substituted phenyl radicals are in particular those which are substituted by 1 or 2 substituents selected from the group consisting of 2 sulfo, 1 alkyl of 1 to 4 carbon atoms, 1 alkoxy of 1 to 4 carbon atoms and 1 chlorine, such as, for example, the 2-sulfophenyl, 3-sulfophenyl, 4-sulfophenyl, 2-sulfo-4-methylphenyl, 2-sulfo-4-methoxyphenyl, 2-sulfo-4-chloro-5-methylphenyl, 2,5-disulfophenyl and 2,5-disulfo-4-methylphenyl radical.

When R⁴ or R⁵ is a substituted phenyl radical, they can also be in particular a phenyl radical which is substituted by a group of the formula —SO₂—Y with Y of the abovementioned, in particular preferred, meaning, or a phenyl radical which is substituted by this group —SO₂—Y and by an alkyl group of 1 to 4 carbon atoms, an alkoxy group of 1 to 4 carbon atoms, a sulfo group or a chlorine atom.

When R⁴ or R⁵ is a substituted naphthyl radical, they can also be in particular a naphthyl radical which is substituted by a group of the formula —SO₂—Y with Y of the abovementioned, in particular the preferred, meaning or a naphthyl radical which is substituted by this group —SO$_2$—Y and 1 or 2 sulfo groups.

Substituted naphthyl radicals are in particular monosulfo-, disulfo- and trisulfo-naphthyl radicals, such as, for example, the 1-sulfonaphth-2-yl, 5-sulfonaphth-2-yl, 6-sulfonaphth-2-yl, 1,5-disulfonaphth-2-yl, 3,6-disulfonaphth-2-yl, 4,8-disulfonaphth-2-yl, 6,8-disulfonaphth-2-yl, 3,6,8-trisulfonaphth-2-yl and 4,6,8-trisulfonaphth-2-yl radical.

Preferably $R^1$ denotes a hydrogen atom, a methyl, ethyl, methoxy, ethoxy or sulfo group.

Preferably $R^2$ denotes a hydrogen atom, a methoxy, ethoxy or a sulfo group or a chlorine atom or a phenoxy group.

Preferably R denotes a methyl or ethyl group, in particular a hydrogen atom.

Preferably A denotes an amino group of the general formula (2c). Preferably herein $R^4$ is a hydrogen atom or an alkyl group of 1 to 4 carbon atoms, $R^5$ is a hydrogen atom, an alkyl group of 1 to 4 carbon atoms or a benzyl or phenethyl group or a sulfo-substituted alkyl group of 2 to 4 carbon atoms or a phenyl group substituted in accordance with the above directions. Preferably B denotes an amino group, an acyl amino group which can be substituted in accordance with the above directions, a phenylamino group which can be substituted in accordance with the above directions, a hydroxy group or an alkoxy group of 1 to 4 carbon atoms. Preferably $R^6$ is the phenyl or p-methylphenyl group, preferably $R^7$ is a hydrogen atom or an alkyl group of 1 to 4 carbon atoms and $R^8$ is a hydrogen atom, an alkyl group of 1 to 4 carbon atoms or an acyl group in accordance with the above directions, which can be substituted, or an alkyl group of 1 to 4 carbon atoms, which is substituted by an alkoxy group of 1 to 4 carbon atoms or a sulfo group, or a phenyl group which is substituted by one or two substitutents from the group consisting of amino, acylamino (in accordance with the above directions), sulfo, alkyl of 1 to 4 carbon atoms, alkoxy of 1 to 4 carbon atoms, nitro and hydroxy.

Preferred azo compounds of the compounds of the general formula (1) are azo compounds conforming to the general formula (1a) and hereof in particular those conforming to the general formula (1b)

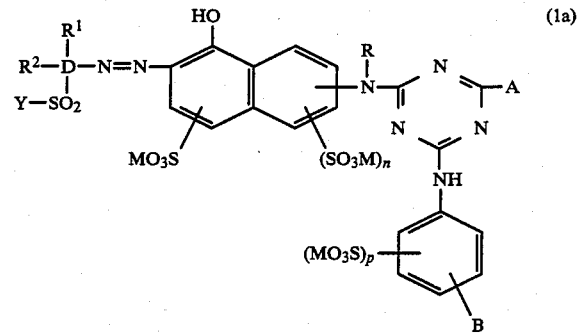

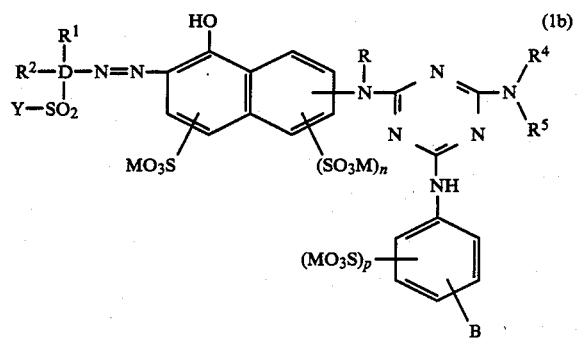

in which D stands for a benzene ring and the other formula members have the abovementioned, in particular preferred, meanings, or in which D is a 2-naphthyl radical, $R^1$ denotes a hydrogen atom or a sulfo group and $R^2$ is a sulfo group or preferably a hydrogen atom and the other formula members have the abovementioned, in particular the preferred, meanings.

Furthermore, of these particular preference is given to azo compounds conforming to the general formula (1c)

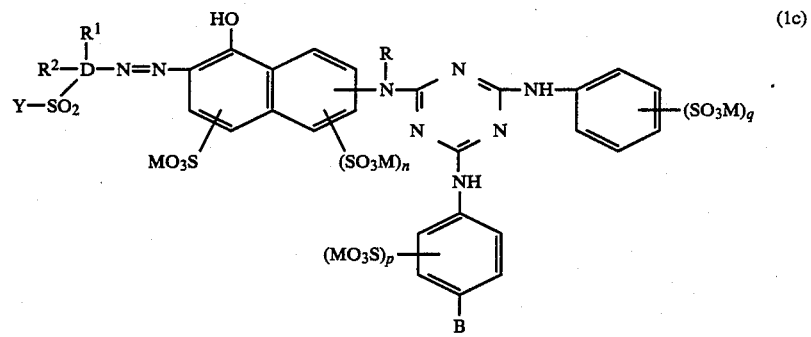

in which the individual formula members have the meanings mentioned for the formula (1), in particular the preferred meanings, and q is the number 1 or 2, and also to azo compounds conforming to the general formula (1d)

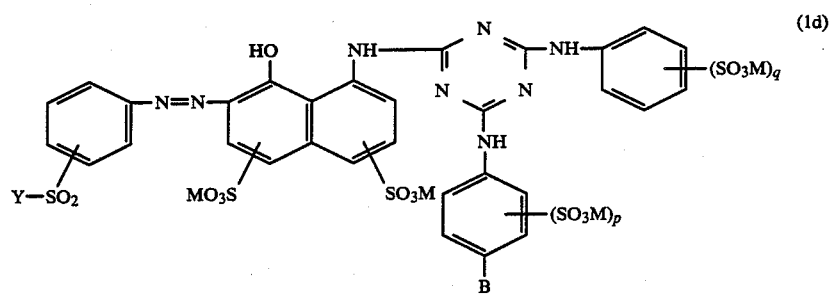

in which B is a radical of the general formula (2f) or (2g) with $R^6$, $R^7$ and $R^8$ of the abovementioned, in particular the preferred, meaning, q stands for the number 1 or 2 and the other formula members have the meanings mentioned for the formula (1), in particular the preferred meanings, and also to azo compounds conforming to the general formula (1e)

in which the individual formula members have the abovementioned, in particular the preferred, meanings, R" is a hydrogen atom, an alkyl group of 1 to 4 carbon atoms, an alkoxy group of 1 to 4 carbon atoms, a sulfo group, a carboxy group, an aryl radical which can be substituted, a hydroxy group, a nitro group or a halogen atom, such as a chlorine or bromine atom, and in which

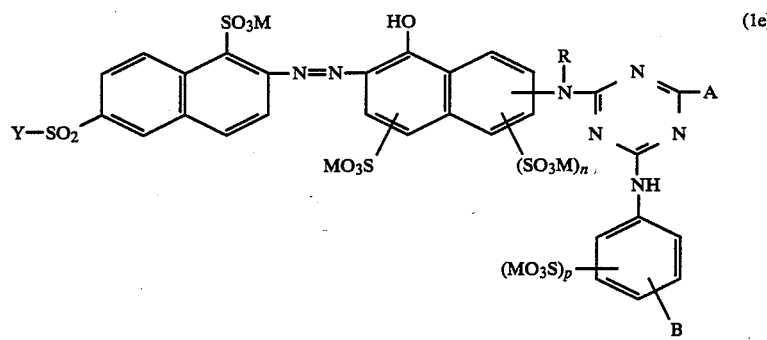

in which the individual formula members have the abovementioned, in particular the preferred, meanings, B standing in particular for a radical of the above-mentioned and defined general formula (2f) or (2g).

Preferred azo compounds according to the invention are furthermore those conforming to the general formula (1f)

R and $R^4$ are identical to one another or different, preferably identical, and each preferably denotes a hydrogen atom or the methyl group, and B stands preferably for a radical of the abovementioned and defined general formula (2f) or (2g).

Preference is further given to azo compounds conforming to the general formula (1g)

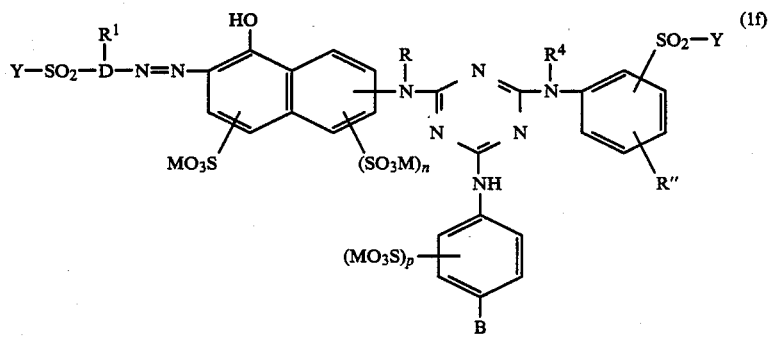

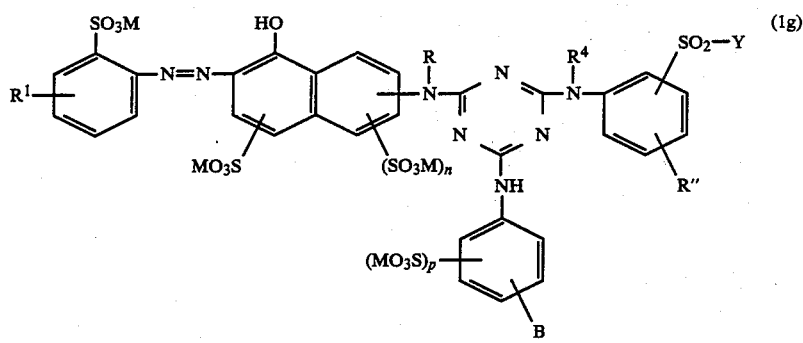

in which the individual formula members have the above-mentioned, in particular the preferred, meanings, B standing in particular for a radical of the abovementioned and defined general formula (2f) or (2g), and also to azo compounds conforming to the general formula (1h)

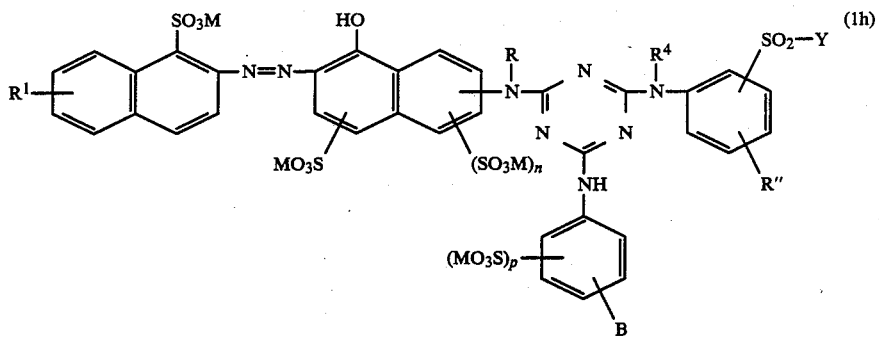

in which the individual formula members have the abovementioned, in particular the preferred, meanings, B standing in particular for a radical of the above-mentioned and defined general formula (2f) or (2g).

Preferably in the compounds of the general formula (1g) $R^1$ denotes a sulfo group or a substituted or unsubstituted aminomethylene group and B denotes a radical of the above formula (2f) or (2g) with the abovementioned preferred meaning or particularly preferably a radical of the above formula (2g) in which $R^7$ stands for a hydrogen and $R^8$ has one of the above preferred meanings.

The present invention also provides processes for preparing the compounds according to the invention of the general formula (1). One of these processes can be carried out for example by reacting an azo compound of the general formula (3)

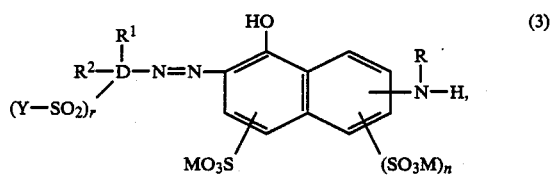

an aromatic amine of the general formula (4) and a compound of the general formula (5)

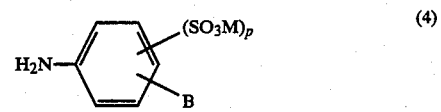

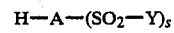

in which D, M, $R^1$, $R^2$, R, n, p, A, B and Y have the abovementioned meanings and r and s each stand for the number 0, 1 or 2 (where in the case of r or s equal to 0, this group denotes a hydrogen atom), with 2,4,6-trichloro-s-triazine (cyanuric chloride) or 2,4,6-trifluoro-s-triazine (cyanuric fluoride) in any desired order or, if desired, simultaneously, the starting compounds of the general formula (3) and (5) being so chosen that the sum of (r+s) has the meaning of m. Since the reactions with the abovementioned four possible starting compounds can be carried out in different orders and, if desired, in some cases even simultaneously, variants of this process according to the invention are possible. Preferably the individual reactions of compounds (3), (4) and (5) with the cyanuric chloride or cyanuric fluoride are carried out in succession.

Important process variants according to the invention for preparing the azo compounds according to the invention of the general formula (1) comprise for example reacting a monohalogenotriazinylaminonaphthol azo compound of the general formula (6)

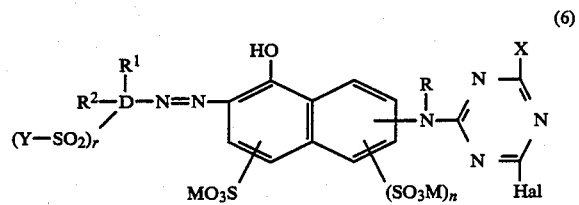

(6)

in which D, M, $R^1$, $R^2$, R, Y, n and r have the abovementioned meanings, Hal is a chlorine or fluorine atom and X stands for a group of the formula (4a) or (5a)

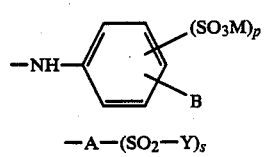

(4a)

$$-A-(SO_2-Y)_s \quad (5a)$$

in which A, B, M, p and s have the abovementioned meaning, with an aromatic amino compound of the abovementioned and defined general formula (4) or a compound of the abovementioned and defined general formula (5), the starting compounds of the formulae (3) and (5) being so chosen that (r+s) has the meaning of m, or reacting a monohalogenotriazine compound of the general formula (7)

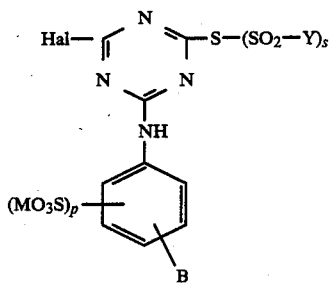

(7)

in which Hal, A, B, M, Y, p and s have the abovementioned meanings, with an azo compound of the abovementioned and defined general formula (3), these starting compounds being so chosen that the sum (r+s) has the meaning of m.

Another process according to the invention can be carried out for example by coupling a triazinylaminonaphtholsulfonic acid compound of the general formula (8)

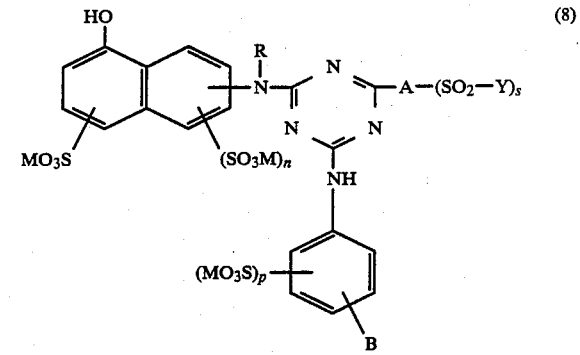

(8)

in which A, B, R, M, Y, n, p and s have the abovementioned meanings, with the diazonium compound of an aromatic amine of the general formula (9)

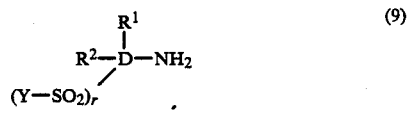

(9)

in which D, $R^1$, $R^2$, Y and r have the abovementioned meanings, the starting compounds being so chosen that the sum (r+s) has the meaning of m.

Those compounds of the general formula (6) in which the formula radical X denotes a group of the abovementioned general formula (4) in which M and p have the indicated meanings while B, however, represents an amino radical of the abovementioned and defined general formula (2g) are not only starting compounds for preparing the azo compounds according to the invention of the general formula (1), but are also, in accordance with the invention, end products having useful fiber-reactive dye properties.

The present invention thus also provides azo compounds of the general formula (1A)

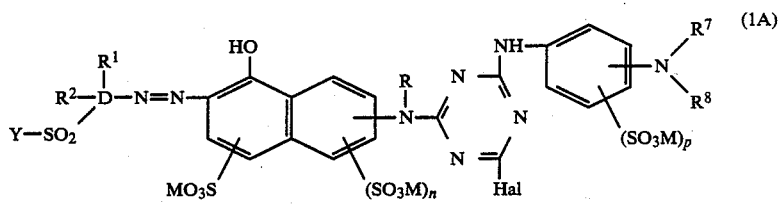

(1A)

in which D, M, $R^1$, $R^2$, R, Y, n, p, $R^7$, $R^8$ and Hal have the abovementioned, in particular the preferred, meanings, although Hal is preferably a chlorine atom, and processes for their preparation, as will be indicated later.

The compounds of the general formula (6) can be prepared in a manner according to the invention by reacting a dihalogenotriazinylaminonaphtholsulfonic acid compound of the general formula (10)

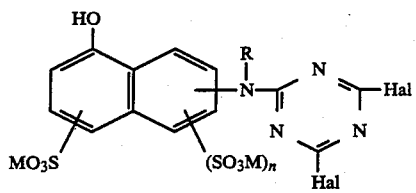

(10)

in which the two Hal's have the abovementioned meanings and are identical to one another and M, R and n have the abovementioned meanings, with an aromatic amine of the general formula (4) to give the monohalogenotriazinylaminonaphtholsulfonic acid compound of the general formula (11)

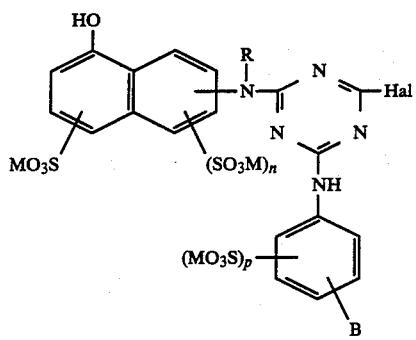

(11)

in which Hal, B, M, R, p and n have the abovementioned meanings, and coupling the latter with the diazonium compound of an aromatic amine of the general formula (9) to give the azo compound of the formula (6) with X equal to the radical of the formula (4a), or by reacting a dihalogenotriazinylaminonaphtholsulfonic acid compound of the abovementioned and defined general formula (10) with a compound of the general formula (5) to give the monohalogenotriazinylaminonaphtholsulfonic acid compound of the general formula (12)

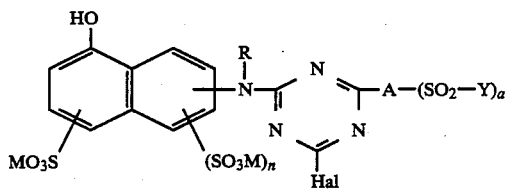

(12)

in which Hal, A, M, R, Y, n and s have the abovementioned meanings, and coupling the latter with the diazonium compound of an aromatic amine of the general formula (9) to give the azo compound of the general formula (6) with X equal to the radical of the formula (5a), or by reacting a dihalogenotriazinylaminonaphtholsulfonic acid-azo compound of the general formula (13)

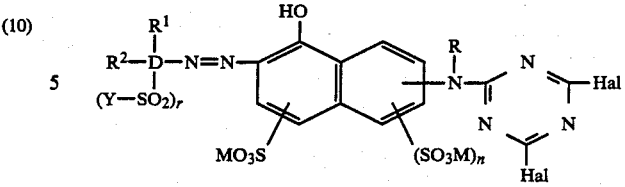

in which Hal, D, M, $R^1$, $R^2$, R, Y, n and r have the abovementioned meanings, with an aromatic compound of the general formula (4) or a compound of the general formula (5), or by condensing a compound of the general formula (5) first with cyanuric chloride or cyanuric fluoride and then reacting the resulting product with an aminonaphtholsulfonic acid to give the monohalogenotriazinylaminonaphtholsulfonic acid compound of the abovementioned and defined general formula (12), and coupling the latter with the diazonium compound of an aromatic amine of the general formula (9) to give the azo compound of the general formula (6) with X equal to the radical of the formula (5a).

In the same way the azo compounds according to the invention of the general formula (1A) can be prepared by coupling a monohalogenotriazinylaminonaphtholsulfonic acid compound of the general formula (11), in which B denotes an amino group of the general formula (2g) and Hal, M, R, p and n have the abovementioned meanings, Hal preferably being a chlorine atom, with the diazonium compound of an aromatic amine of the general formula (9), in which D, $R^1$, $R^2$ and Y have the abovementioned meanings and r stands for the number 1, or by reacting a dihalogenotriazinylaminonaphtholsulfonic acid-azo compound of the general formula (13) in which Hal has the abovementioned meaning, but both are preferably a chlorine atom, r denotes the number 1 and D, $R^1$, $R^2$, R, M, Y and n have the above-mentioned meanings, with an aromatic compound of the general formula (4) in which M and p have the meanings mentioned and B stands for an amino group of the general formula (2g) with $R^7$ and $R^8$ of the abovementioned meaning.

The dihalogenotriazinylaminonaphtholsulfonic acid-azo compound of the general formula (13) can in turn be prepared for example by coupling the diazonium compound of an aromatic amine of the general formula (9) with a dihalogenotriazinylaminonaphtholsulfonic acid of the general formula (10) or by reacting an aminoazo compound of the general formula (3) with cyanuric chloride or cyanuric fluoride. Such methods as well as the starting compounds mentioned are known per se.

In the same way, the starting compounds conforming to the general formula (7) can be prepared analogously to methods known per se by reacting cyanuric chloride or cyanuric fluoride in any order with the compounds of the formula (4) and (5). The starting compounds of the general formula (3) are similarly obtainable analogously to known methods by coupling the diazonium compound of an aromatic amine of the general formula (9) with the aminonaphtholsulfonic acid derivable from the general formula (3).

Both the reaction of cyanuric chloride or cyanuric fluoride with a compound of the general formula (4) or (5) and the reaction of a dihalogenotriazinylaminonaphtholsulfonic acid compound of the general formula (10) with a compound of the formula (4) or (5) and likewise the reaction of a dihalogenotriazinylaminonaphtholsulfonic acid-azo compound of the general formula (13) with a compound of the formula (4) or (5) can take place in an organic or aqueous organic medium. Preferably the reaction takes place in an aqueous medium in the presence of acid-binding agents, such as alkali metal or alkaline earth metal carbonates, alkali metal or alkaline earth metal hydrogencarbonates or hydroxides or alkali metal acetates or a basic alkali metal phosphate, the alkali and alkaline earth metals preferably being those of sodium, potassium and calcium. Furthermore, the addition of small amounts of a commercially available wetting agent can be expedient. If the aqueous medium has added to it an organic water-miscible inert solvent, the latter is preferably acetone or N-methylpyrrolidone. These condensation reactions are carried out at a temperature between 0° and 90° C., preferably between 0° and 60° C., and at a pH value between 1.5 and 7, in particular between 2 and 5.

In the same way the reaction of the monohalogenotriazine compound conforming to the general formula (7) with an aminonaphtholsulfonic acid-azo compound of the general formula (3) or with the aminonaphtholsulfonic acid as naphtholic coupling component and also the reaction of the monohalogenotriazine compound of the general formula (6) with a compound of the general formula (4) or (5) can take place in an aqueous-organic or preferably in an aqueous medium. Preferably the reaction takes place in an aqueous medium in the presence of acid-binding agents, such as alkali metal or alkaline earth metal carbonates, alkali metal or alkaline earth metal hydrogencarbonates or hydroxides or alkali metal acetates or a basic alkali metal phosphate, the alkali and alkaline earth metals preferably being those of sodium, potassium and calcium. Furthermore, the addition of small amounts of a commercially available wetting agent can be expedient. If the aqueous medium has added to it an organic water-miscible inert solvent, the latter is preferably acetone. These condensation reactions are carried out at a temperature between 0° and 90° C., preferably between 50° and 90° C., and at a pH value between 3 and 9, in particular between 5 and 7.

The coupling reaction according to the invention of the diazonium compound of an amine of the formula (9) with a compound of the general formula (8), (10), (11) or (12) can likewise be carried out in an aqueous-organic medium; it is preferably carried out in an aqueous medium in a weakly acid to neutral, if desired very weakly alkaline, pH range at a temperature between 0° and 50° C. Preferably the coupling reactions are carried out at a pH value between 3 and 7 and a temperature between 5° and 20° C. The basically possible coupling in the alkaline range should be avoided in order to avoid damaging the fiber-reactive group, in particular that conforming to the general formula —$SO_2$—Y.

A further process according to the invention serves for preparing those azo compounds according to the invention of the general formula (1) in which Y stands for the β-sulfatoethyl group; this process comprises esterifying an azo compound which conforms to the general formula (1), but in which one or both of the formula radicals Y stand for a β-hydroxyethyl group, in a manner known per se with a sulfating agent. Sulfating agents are for example 96 to 100% strength sulfuric acid or sulfuric acid containing sulfur trioxide, or chlorosulfonic acid. It is preferable to use 98 to 100% sulfuric acid, the reaction temperature being maintained between 0° and 20° C.

A further process according to the invention serves for preparing those azo compounds according to the invention of the general formula (1) in which Y stands for the β-thiosulfatoethyl group; this process comprises converting an azo compound according to the invention of the general formula (1) which contains 1 or 2 β-sulfatoethylsulfonyl groups in a manner known per se in an alkaline aqueous medium, such as, for example, at a pH value between 8 and 12, in particular between 9.5 and 10.5, and at a temperature between 10° and 40° C. first into its vinylsulfonyl compound and then reacting the latter, after setting a pH value between 4 and 7, with an alkali metal thiosulfate at a temperature between 0° and 40° C.

Amino compounds of the general formula (9) which in a manner according to the invention serve for synthesizing the compounds (1) and (1A) according to the invention and contain a group of the above-defined formula —$SO_2$—Y are for example: 1-amino-4-(β-sulfatoethylsulfonyl)-benzene, 1-amino-3-(β-sulfatoethylsulfonyl)-benzene, 1-amino-2-(β-sulfatoethylsulfonyl)-benzene, 1-amino-2-methoxy-5-(β-sulfatoethylsulfonyl)-benzene, 1-amino-2-methoxy-4-(β-sulfatoethylsulfonyl)-benzene, 1-amino-4-methoxy-3-(β-sulfatoethylsulfonyl)-benzene, 1-amino-2-hydroxy-5-(β-sulfatoethylsulfonyl)-benzene, 1-amino-2-hydroxy-4-(β-sulfatoethylsulfonyl)-benzene, 1-amino-2-methyl-4-(β-sulfatoethylsulfonyl)-benzene, 1-amino-2-methyl-5-(β-sulfatoethylsulfonyl)-benzene, 1-amino-4-methyl-3-(β-sulfatoethylsulfonyl)-benzene, 1-amino-2-chloro-4-(β-sulfatoethylsulfonyl)-benzene, 1-amino-2-chloro-5-(β-sulfatoethylsulfonyl)-benzene, 1-amino-4-chloro-5-(β-sulfatoethylsulfonyl)-benzene, 1-amino-2-bromo-4-(β-sulfatoethylsulfonyl)-benzene, 1-amino-2-carboxy-5-(β-sulfatoethylsulfonyl)-benzene, 1-amino-2-carboxy-4-(β-sulfatoethylsulfonyl)-benzene, 1-amino-2-sulfo-4-(β-sulfatoethylsulfonyl)-benzene, 1-amino-2-sulfo-5-(β-sulfatoethylsulfonyl)-benzene, 1-amino-2,5-dimethoxy-4-(β-sulfatoethylsulfonyl)-benzene, 1-amino-2,4-dimethoxy-5-(β-sulfatoethylsulfonyl)-benzene, 1-amino-2,5-diethoxy-4-(β-sulfatoethylsulfonyl)-benzene, 1-amino-2-methoxy-5-methyl-4-(β-sulfatoethylsulfonyl)-benzene, 1-amino-2-methyl-5-methoxy-4-(β-sulfatoethylsulfonyl)-benzene, 1-amino-2,5-dimethyl-4-(β-sulfatoethylsulfonyl)-benzene, 1-amino-2,4-disulfo-5-(β-sulfatoethylsulfonyl)-benzene, 2-amino-1-sulfo-6-(β-sulfatoethylsulfonyl)-naphthalene, 2-amino-6-sulfo-8-(β-sulfatoethylsulfonyl)-naphthalene, 1-amino-6-sulfo-4-(β-sulfatoethylsulfonyl)-naphthalene, 1-amino-7-sulfo-5-(β-sulfatoethylsulfonyl)-naphthalene, 1-amino-4-sulfo-6-(β-sulfatoethylsulfonyl)-naphthalene, 1-amino-4-sulfo-7-(β-sulfatoethylsulfonyl)-naphthalene, 2-amino-1-sulfo-5-(β-sulfatoethylsulfonyl)-naphthalene, 2-amino-1,7-disulfo-5-(β-sulfatoethylsulfonyl)-naphthalene, 2-amino-8-sulfo-6-(β-sulfatoethylsulfonyl)-naphthalene, 1-amino-4-(β-sulfatoethylsulfonyl)-naphthalene, 1-amino-5-(βsulfatoethylsulfonyl)-naphthalene, 1-amino-6-(β-sulfatoethylsulfonyl)-naphthalene, 1-amino-7-(β-sulfatoethylsulfonyl)-naphthalene, 1-amino-2-ethoxy-6-(β-sulfatoethylsulfonyl)-naphthalene, 2-amino-5-(β-sulfatoethylsulfonyl)-naphthalene, 2-amino-6-(β-sulfatoethylsulfonyl)-naphthalene, 2-amino-7-(β-sulfatoethylsulfonyl)-naphthalene and 2-amino-8-(β-sulfatoethylsulfonyl)-naphthalene and their corresponding β-thiosulfatoethylsulfonyl, β-phosphatoethylsulfonyl, β-chloroethylsulfonyl and vinylsulfonyl derivatives.

Aromatic amino compounds of the general formula (9) which according to the invention serve for the preparation of the compounds (1) and which contain no fiber-reactive group conforming to the general formula $-SO_2-Y$ are for example: 1-aminobenzene-2-sulfonic acid, 1-aminobenzene-3- and -4-sulfonic acid, 2-amino-4-sulfobenzoic acid, 2-amino-5-sulfobenzoic acid, 4-amino-2-sulfobenzoic acid, 4-aminotoluene-2- and 3-sulfonic acid, 2-aminotoluene-4- and -5-sulfonic acid, 2-aminotoluene-4-carboxylic acid, anthranilic acid, aniline, 2-, 3- and 4-methylaniline, 2-, 3- and 4-anisidine, 2-, 3- and 4-chloroaniline, 4-aminobenzoic acid, 2-aminoanisole-4- and -5-sulfonic acid, 4-aminoanisole-2- and -3-sulfonic acid, 3-chloro-2-aminotoluene-5-sulfonic acid, 4-chloro-2-aminotoluene-5-sulfonic acid, 5-chloro-2-aminotoluene-3- and -4-sulfonic acid, 6-chloro-2-aminotoluene-4-sulfonic acid, 6-chloro-3-aminotoluene-4-sulfonic acid, 1-aminobenzene-2,5-disulfonic acid, 1-aminobenzene-2,4- and -3,5-disulfonic acid, 2-aminotoluene-3,5-disulfonic acid, 2-aminotoluene-4,5- and -4,6-disulfonic acid, 4-aminotoluene-2,5-disulfonic acid, 2-aminonaphthalene-1-sulfonic acid, 2-aminonaphthalene-5- and -6-sulfonic acid, 2-aminonaphthalene-7- and -8-sulfonic acid, 1-aminonaphthalene-2-, -3-, -4-, -5-, -6-, -7- and -8-sulfonic acid, 2-aminonaphthalene-4,8-disulfonic acid, 2-aminonaphthalene-6,8-disulfonic acid, 2-aminonaphthalene-1,5- and -1,7-disulfonic acid, 2-aminonaphthalene-5,7-, -3,6-, -3,7- and -4,7-disulfonic acid, 1-aminonaphthalene-2,4-, -2,5-, -3,6-, -3,7-, -3,8-, -4,6-, -4,7-, -4,8-, -5,7- and -6,8-disulfonic acid, 2-aminonaphthalene-3,6,8-trisulfonic acid, 2-aminonaphthalene-4,6,8-and -1,5,7-trisulfonic acid, 1-aminonapthalene-2,4,7-trisulfonic acid, 1-aminonapthalene-2,4,8-, -3,5,7-, -3,6,8- and -4,6,8-trisulfonic acid.

Aminonaphtholsulfonic acids which serve for synthesizing the azo compounds (1) and (1A) according to the invention and which, if desired after conversion into their triazinylamino derivatives, are coupled in the ortho-position relative to the hydroxy group with the diazonium compound of the aromatic amine of the general formula (9) are in particular 1-amino-3,6-disulfo-8-naphthol, 1-amino-4,6-disulfo-8-naphthol, 2-amino-3,6-disulfo-8-naphthol, 3-amino-6-sulfo-8-naphthol, 3-amino-4,6-disulfo-8-naphthol, 3-methylamino-6-sulfo-8-naphthol, 4-amino-6-sulfo-8-naphthol, 2-amino-6-sulfo-8-naphthol, 1-amino-4-sulfo-8-naphthol and 2-methylamino-6-sulfo-8-naphthol.

Compounds conforming to the general formula (5) which serve as starting compounds for synthesizing the azo compounds (1) according to the invention are for example: 1-amino-4-($\beta$-sulfatoethylsulfonyl)-benzene, 1-amino-3-($\beta$-sulfatoethylsulfonyl)-benzene, 1-amino-2-($\beta$-sulfatoethylsulfonyl)-benzene, 1-amino-2-methoxy-5-($\beta$-sulfatoethylsulfonyl)-benzene, 1-amino-4-methoxy-3-($\beta$-sulfatoethylsulfonyl)-benzene, 1-amino-2-hydroxy-5-($\beta$-sulfatoethylsulfonyl)-benzene, 1-amino-2-hydroxy-4-($\beta$-sulfatoethylsulfonyl)-benzene, 1-amino-2-methyl-4-($\beta$-sulfatoethylsulfonyl)-benzene, 1-amino-2-methyl-5-($\beta$-sulfatoethylsulfonyl)-benzene, 1-amino-4-methyl-3-($\beta$-sulfatoethylsulfonyl)-benzene, 1-amino-2-chloro-4-($\beta$-sulfatoethylsulfonyl)-benzene, 1-amino-2-chloro-5-($\beta$-sulfatoethylsulfonyl)-benzene, 1-amino-4-chloro-5-($\beta$-sulfatoethylsulfonyl)-benzene, 1-amino-2-bromo-4-($\beta$-sulfatoethylsulfonyl)-benzene, 1-amino-2-carboxy-5-($\beta$-sulfatoethylsulfonyl)-benzene, 1-amino-2-carboxy-4-($\beta$-sulfatoethylsulfonyl)-benzene, 1-amino-2-sulfo-4-($\beta$-sulfatoethylsulfonyl)-benzene, 1-amino-2-sulfo-5-($\beta$-sulfatoethylsulfonyl)-benzene, 1-amino-2,5-dimethoxy-4-($\beta$-sulfatoethylsulfonyl)-benzene, 1-amino-2,4-dimethoxy-5-($\beta$-sulfatoethylsulfonyl)-benzene, 1-amino-2,5-diethoxy-4-($\beta$-sulfatoethylsulfonyl)-benzene, 1-amino-2-methoxy-5-methyl-4-($\beta$-sulfatoethylsulfonyl)-benzene, 1-amino-2-methyl-5-methoxy-4-($\beta$-sulfatoethylsulfonyl)-benzene, 1-amino-2,5-dimethyl-4-($\beta$-sulfatoethylsulfonyl)-benzene, 1-amino-2,6-dibromo-4-($\beta$-sulfatoethylsulfonyl)-benzene, 1-amino-2,4-disulfo-5-($\beta$-sulfatoethylsulfonyl)-benzene, 2-amino-1-sulfo-6-($\beta$-sulfatoethylsulfonyl)-naphthalene, 2-amino-6-sulfo-8-($\beta$-sulfatoethylsulfonyl)-naphthalene, 1-amino-6-sulfo-4-($\beta$-sulfatoethylsulfonyl)-naphthalene, 1-amino-7-sulfo-5-($\beta$-sulfatoethylsulfonyl)-naphthalene, 1-amino-4-sulfo-6-($\beta$-sulfatoethylsulfonyl)-naphthalene, 1-amino-4-sulfo-7-($\beta$-sulfatoethylsulfonyl)-naphthalene, 2-amino-1-sulfo-5-($\beta$-sulfatoethylsulfonyl)-naphthalene, 2-amino-1,7-disulfo-5-($\beta$-sulfatoethylsulfonyl)-naphthalene, 2-amino-8-sulfo-6-($\beta$-sulfatoethylsulfonyl)-naphthalene, 1-amino-4-($\beta$-sulfatoethylsulfonyl)-naphthalene, 1-amino-5-($\beta$-sulfatoethylsulfonyl)-naphthalene, 1-amino-6-($\beta$-sulfatoethylsulfonyl)-naphthalene, 1-amino-7-($\beta$-sulfatoethylsulfonyl)-naphthalene, 1-amino-2-ethoxy-6-($\beta$-sulfatoethylsulfonyl)-naphthalene, 2-amino-5-($\beta$-sulfatoethylsulfonyl)-naphthalene, 2-amino-6-($\beta$-sulfatoethylsulfonyl)-naphthalene, 2-amino-7-($\beta$-sulfatoethylsulfonyl)-naphthalene and 2-amino-8-($\beta$sulfatoethylsulfonyl)-naphthalene and their corresponding $\beta$-thiosulfatoethylsulfonyl, $\beta$-phosphatoethylsulfonyl, $\beta$-chloroethylsulfonyl and vinylsulfonyl derivatives, 1-aminobenzene-2-sulfonic acid, 1-aminobenzene-3- and -4-sulfonic acid, 2-amino-4-sulfobenzoic acid, 2-amino-5-sulfobenzoic acid, 4-amino-2-sulfobenzoic acid, 4-aminotoluene-2- and -3-sulfonic acid, 2-aminotoluene-4- and -5-sulfonic acid, 2-aminotoluene-4-carboxylic acid, anthranilic acid, aniline, 2-, 3- and 4-methylaniline, 2-, 3- and 4-anisidine, 2-, 3- and 4-chloroaniline, 4-aminobenzoic acid, 2-aminoanisole-4- and -5-sulfonic acid, 4-aminoanisole-2- and -3-sulfonic acid, 3-chloro-2-aminotoluene-5-sulfonic acid, 4-chloro-2-aminotoluene-5-sulfonic acid, 5-chloro-2-aminotoluene-3- and -4-sulfonic acid, 6-chloro-2-aminotoluene-4-sulfonic acid, 6-chloro-3-aminotoluene-4-sulfonic acid, 1-aminobenzene-2,5-disulfonic acid, 1-aminobenzene-2,4- and -3,5-disulfonic acid, 2-aminotoluene-3,5-disulfonic acid, 2-aminotoluene-4,5- and -4,6-disulfonic acid, 4-aminotoluene-2,5-disulfonic acid, 2-(3'-sulfo-4'-aminophenyl)-6-methylbenzthiazole-7-sulfonic acid, 2-aminonaphthalene-1-sulfonic acid, 2-aminonaphthalene-5- and -6-sulfonic acid, 2-aminonaphthalene-7- and -8-sulfonic acid, 1-aminonaphthalene-2-, -3-, -4-, -5-, -6-, -7- and -8-sulfonic acid, 2-aminonaphthalene-4,8-disulfonic acid, 2-aminonaphthalene-6,8-disulfonic acid, 2-aminonaphthalene-1,5- and -1,7-disulfonic acid, 2-aminonaphthalene-5,7-, -3,6-, -3,7- and -4,7-disulfonic acid, 1-aminonaphthalene-2,4-, -2,5-, -3,6-, -3,7-, -3,8-, -4,6-, -4,7-, -4,8-, -5,7- and -6,8-disulfonic acid, 2-aminonaphthalene-3,6,8-trisulfonic acid, 2-aminonaphthalene-4,6,8- and -1,5,7-trisulfonic acid, 1-aminonaphthalene-2,4,7-trisulfonic acid, 1-aminonaphthalene-2,4,8-, -3,5,7-, -3,6,8- and -4,6,8-trisulfonic acid, ethylamine, ethanolamine, taurine, methyltaurine, bis-[$\beta$-($\beta$'-chloroethylsulfonyl)-ethyl]amine, aminoacetic acid, diethanolamine, phenol, methanol, ethanol, n-propanol, isopropanol and water.

Aromatic amines conforming to the general formula (4) which according to the invention serve as starting compounds for preparing the azo compounds (1) and (1A) are for example: 2-aminoacetanilide, 3-aminoacetanilide, 4-aminoacetanilide, 1,2- phenylenediamine, 1,3-phenylenediamine, 1,4-phenylenediamine, 2-formylaminoaniline, 3-formylaminoaniline, 4-formylaminoaniline, 2-propionylaminoaniline, 3-propionylaminoaniline, 4-propionylaminoaniline, 4-benzoylaminoaniline, 1,2-phenylenediamine-3-sulfonic acid, 1,2-phenylenediamine-4-sulfonic acid, 1,4-phenylenediamine-2-sulfonic acid, 1,4-phenylenediamine-2,5-disulfonic acid, 4-acetylamino- or 4-benzoylamino-3-sulfoaniline, 4-acetylamino- or 4-benzoylamino-2-sulfoaniline, 4-acetylamino- or 4-benzoylamino-2,5-disulfoaniline, 4-aminodiphenylamine, 4-amino-3'-sulfodiphenylamine, 4-amino-2-sulfodiphenylamine, 2-amino-4-sulfodiphenylamine, N-tolyl-1,4-phenylenediamine-3-sulfonic acid, N-chlorophenyl-1,4-phenylenediamine-3-sulfonic acid, 4-amino-2'-sulfo-4'-nitrodiphenylamine, N-methyl- or N-ethyl-4-amino-2-sulfodiphenylamine, N-methyl- or N-ethyl-2-amino-4-sulfodiphenylamine, 4-ethylaminoaniline, 4-methylaminoaniline, 4-dimethylaminoaniline, 4-diethylaminoaniline, 4-amino-4'-nitro-2'-sulfodiphenylamine, 4-di-(n-butyl)-aminoaniline, 4-ethylamino- or 4-methylamino-2-sulfoaniline, 4-methylamino- or 4-ethylamino-3-sulfoaniline, 4-dimethylamino- or 4-diethylamino-2-sulfoaniline, 4-dimethylamino- or 4-diethylamino-3-sulfoaniline, 4-methylamino- or 4-ethylamino-2,5-disulfoaniline, 4-dimethylamino- or 4-diethylamino-2,5-disulfoaniline, 2,4-dimethoxyaniline, 3,4-dimethoxyaniline, 2-ethoxyaniline, 4-ethoxyaniline, 2-methoxy-aniline, 4-methoxyaniline, 2-aminophenol, 4-aminophenol, 2-aminodiphenylether, 4-aminodiphenylether, 4-methoxy-3-sulfoaniline, 4-ethoxy-3-sulfoaniline, 4-amino-3-sulfodiphenyl ether, 4,4'-diaminodiphenyl-2-sulfonic acid, N-(ω-sulfoacetyl)-1,4-diaminobenzene and N-(ω-sulfopropionyl)-1,4-diaminobenzene.

The compounds prepared according to the invention are separated out of the synthesis batches by generally known methods either by precipitating from the reaction medium by means of electrolytes, such as, for example, sodium chloride or potassium chloride, or by evaporating the reaction solution, for example by spraydrying, it being possible to add a buffer substance to this reaction solution. The new compounds (1) and (1A) according to the invention have fiber-reactive properties and possess very good dye properties. They can therefore be used for dyeing hydroxy- and/or carboxamido groups containing material, in particular fiber material, as well as leather. Similarly, the solutions obtained in the synthesis of the compounds according to the invention, if desired after addition of a buffer substance and if desired after concentrating, can also be directly used in dyeing as a liquid product.

The present invention therefore also relates to the use of the compounds according to the invention of the general formula (1) or of the general formula (1A) for dyeing hydroxy- and carboxamido-containing materials, or rather to processes for their application to these substrates. Included herein is mass coloration, for example of polyamide films, and dyeing by printing. Preferably the materials are used in the form of fiber materials, in particular in the form of textile fibers, such as yarns, wound packages and fabrics.

Hydroxy-containing materials are natural or synthetic hydroxy-containing materials, such as, for example, cellulose fiber materials or their regenerated products and polyvinyl alcohols. Cellulose fiber materials are preferably cotton, but also other vegetable fibers, such as linen, hemp, jute and ramie fibers; regenerated cellulose fibers are for example staple and filament viscose rayon.

Carboxamido-containing materials are for example synthetic and natural polyamides and polyurethanes, in particular in the form of fibers, for example wool and other animal hairs, silk, leather, nylon-6.6, nylon-6, nylon-11 and nylon-4.

The compounds according to the invention can be applied to and fixed on the substrates mentioned, in particular the fiber materials mentioned, by the application techniques known for water-soluble dyes, in particular for fiber-reactive dyes.

For instance, applied by exhaust processes from a long liquor using various acid-binding agents and optionally neutral salts, such as sodium chloride or sodium sulfate, they produce very good color yields and an excellent color buildup on cellulose fibers. Dyeing is carried out at temperatures between 40° and 105° C., if desired at temperatures up to 130° C. under pressure, optionally in the presence of customary dyeing assistants, in an aqueous bath. A possible dyeing procedure comprises entering the warm bath with the material and gradually raising the bath to the desired dyeing temperature and completing the dyeing process at that temperature. The neutral salts which speed up the exhaustion of the dye may also be added to the bath only when the actual dyeing temperature has been reached.

Padding likewise produces excellent color yields and very good color buildup on cellulose fibers, and the dyes can be fixed by leaving to stand at room temperature or elevated temperature, for example up to about 60° C., by steaming or by means of dry heat in conventional manner.

Strong prints having well-defined contours and a clear white ground are likewise obtained by the customary printing processes for cellulose fibers, which can be carried out either as one-step processes, for example by printing with a print paste containing sodium bicarbonate or some other acid-binding agent and the colorant and by subsequent steaming at 100° to 103° C., or as two-step processes, for example by printing with a neutral or weakly acid print paste which contains the colorant and subsequently fixing either by passing the printed material through a hot electrolyte-containing alkaline bath or by overpadding with an alkaline electrolyte-containing padding liquor and subsequently leaving this treated material or subsequent steaming or subsequent treatment with dry heat. The outcome of the prints varies only litle with varying fixing conditions. The degrees of fixation obtained with the compounds according to the invention are very high both in dyeing and in printing.

In fixing by means of dry heat by the customary thermofixing processes, hot air at 120° to 200° C. is used. In addition to the customary steam at 101° to 103° C., it is also possible to use superheated steam and high-pressure steam at temperatures up to 160° C.

The agents which have an acid-binding effect and cause the dyes to become fixed on the cellulose fibers are for example water-soluble basic salts of the alkali metals and of the alkaline earth metals of inorganic or organic acids, as well as compounds which liberate alkali when hot.

To be mentioned in particular are the alkali metal hydroxides and alkali metal salts of weak to medium strength inorganic or organic acids, the alkali compounds being preferably the sodium and potassium compounds. Such acid-binding agents are for example sodium hydroxide, potassium hydroxide, sodium carbonate, sodium bicarbonate, potassium carbonate, sodium formate, sodium dihydrogenphosphate and disodium hydrogenphosphate.

By treating the compounds according to the invention with the acid-binding agents, optionally while heating, the compounds according to the invention (dyes) are bonded chemically to the cellulose fiber; in particular the dyeings on cellulose have excellent wet-fastness properties after the cuatomary aftertreatment by rinsing to remove unfixed dye portions, especially since unfixed dye portions can easily be washed off owing to their ready cold-water solubility.

Dyeings on polyurethane and polyamide fibers are customarily carried out from an acid medium. For instance, the dyebath can have added to it acetic acid and/or ammonium sulfate and/or acetic acid and ammonium acetate or sodium acetate in order to obtain the desired pH value. To obtain a usable levelness of the dyeing, it is advisable to add customary leveling assistants, such as, for example, based on a reaction product of cyanuric chloride with three times the molar amount of an aminobenzenesulfonic acid and/or of an aminonaphthalenesulfonic acid or based on a reaction product of, for example, stearylamine with ethylene oxide. In general, the material to be dyed is introduced into the bath at a temperature of about 40° C. and is agitated therein for some time, the dye bath is then brought to the desired weakly acid, preferably weakly acetic acid, pH value, and the actual dyeing is carried out at a temperature between 60° and 98° C. However, the dyeings can also be carried out at the boil or at temperatures up to 100° C. (under pressure).

The dyeings and prints on cellulose fiber materials prepared with the azo compounds according to the invention have a high tinctorial strength and also good light fastness properties and very good wet fastness properties, such as wash, fulling, water, seawater, cross-dyeing and perspiration fastness properties, and also very good pleating fastness, hot press fastness and crock fastness. Particularly noteworthy are their alkaline perspiration light fastness and the good wet light fastness of dyeings wetted with tap water. In this respect the azo compounds according to the invention are superior to the structurally nearest comparable azo dyes which likewise contain as reactive group a vinylsulfonyl group bonded to the dye molecule.

The examples below serve to illustrate the invention. The compounds described by formula are indicated in the form of the free acids; in general they are prepared and isolated in the form of their sodium or potassium salts and used in the form of their salts for dyeing. Similarly, the starting compounds mentioned in the examples below, in particular the tabulated examples, in the form of the free acid can be used as such or in the form of their salts, preferably alkali metal salts, such as sodium or potassium salts, in the synthesis. The parts and percentages mentioned in the examples are by weight, unless otherwise stated. Parts by weight relate to parts by volume as the kilogram relates to the liter.

EXAMPLE 1

(a) 295 parts of 4-(β-sulfatoethylsulfonyl)-aniline are dissolved with 56 parts of anhydrous sodium carbonate in 500 parts of water and stirred into a suspension of 194 parts of 2,4,6-trichloro-1,3,5-triazine in 500 parts of ice and 500 parts of water. Stirring is continued at 0° to 10° C. while maintaining a pH of 4.5 until the condensation reaction has ended, and 319 parts of 1-amino-3,6-disulfo-8-naphthol are then added, and the batch is brought to pH 4.5 with sodium carbonate and, while this pH value is maintained, heated to 50° C. Stirring is continued under these conditions for a further period until the condensation reaction has ended, and the batch is filtered to remove undissolved matter.

(b) A suspension of 173.2 parts of 2-sulfoaniline in 750 parts of ice-water is brought with sulfuric acid to pH 2; diazotization is effected with 200 parts by volume of an aqueous 5N sodium nitrite solution while maintaining the pH value of 2 by means of sulfuric acid. Stirring is continued for 1 more hour, and excess nitrous acid is removed in conventional manner with amidosulfonic acid.

(c) The diazonium salt suspension prepared under (b) is stirred into the solution of the coupling components prepared under a), a pH value between 5 and 6 being set and maintained until the coupling reaction is ended. The batch is then heated to 60° C., and 150 parts of 4-acetylaminoaniline are gradually added while stirring, and a pH value of 6 and a temperature of 60° to 65° C. are maintained for approximately a further three hours until the condensation reaction has ended.

The azo compound according to the invention is isolated from the reaction solution after customary clarification either by spray-drying or by salting out with sodium chloride. This gives a red product (which contains electrolyte salts, such as sodium chloride and sodium sulfate) of the sodium salt of the compound according to the invention of the formula

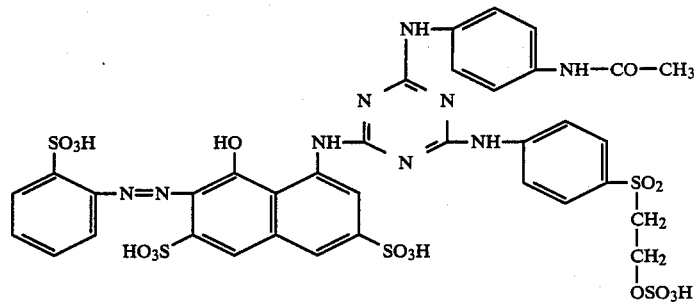

which has very good dye properties and exhibits in aqueous solution in the visible range an absorption peak at 535 nm. The compound according to the invention (in the form of its alkali metal salt) dyes cellulose fiber materials by the application and fixing methods customary for fiber reactive dyes in deep bright weakly yellowish red shades. The dyeings and prints obtainable with the compound according to the invention have very good wet fastness properties, such as in particular very good wash fastness properties, good wet light fastness properties and in particular a good alkaline perspiration light fastness.

EXAMPLE 2

190 parts of cyanuric chloride are suspended in 500 parts of ice and 500 parts of water, and 319 parts of 1-amino-3,6-disulfo-8-naphthol are then added with stirring. While stirring continues at a temperature between 0° and 8° C., a pH value between 2 and 2.5 is maintained by means of about 120 parts of sodium carbonate. The result is a solution which can be clarified.

To this solution is added a diazonium salt suspension prepared as described in Example 1b) from 173.2 parts of 2-sulfoaniline, the batch is subsequently stirred at a maintained pH value of 5.5 until the coupling has ended, a solution having a pH value of 4.5 of 295 parts of 3-(β-sulfatoethylsulfonyl)-aniline in 350 parts of water is then added, the reaction batch is heated to 40° to 45° C. while a pH value of 4.5 is maintained, and stirring is continued under these conditions until the condensation reaction has ended. 150 parts of 4-acetylaminoaniline are then added, which is followed by a further 3 to 4 hours of stirring at a pH value of 6.0 and a temperature of 60° to 65° C. and isolation of the compound according to the invention by spray-drying or salting out.

This gives, in the form of an electrolyte-containing powder, the sodium salt of the compound of the formula

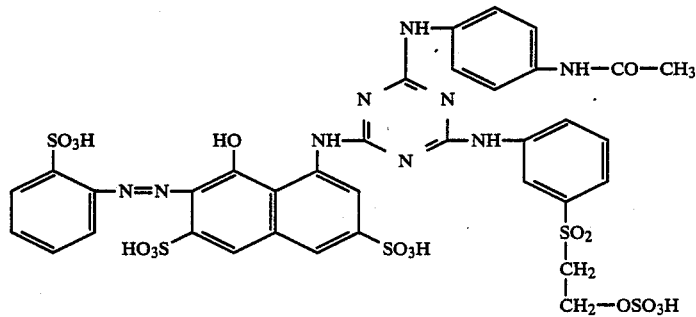

The compound according to the invention has very good fiber-reactive dye properties and exhibits in aqueous solution in the visible range an absorption peak at 535 nm. Like the compound of Example 1, it provides on cellulose fiber materials equally good dyeings and prints having a weakly yellowish red shade.

EXAMPLE 3

A neutral solution of 319 parts of 1-amino-3,6-disulfo-8-naphthol in 500 parts of water and 500 parts of ice has added to it with thorough stirring in the course of 5 minutes 142 parts of 2,4,6-trifluoro-1,3,5-triazine. After 30 minutes a neutral solution of 180 parts of 3-sulfoaniline in 350 parts of water is added, and the second condensation reaction is carried out at a temperature between 20° and 35° C. and at a pH value of 4.5.

To this batch is added a diazonium salt suspension which has been obtained in conventional manner by diazotizing a solution, acidified with sulfuric acid, of 289 parts of 4-(β-sulfatoethylsulfonyl)-aniline in about 1200 parts of water at 0° to 5° C. The coupling reaction takes place at a pH value of 4.5. After the coupling has ended, the batch is heated to 55° C., 150 parts of 4-acetylaminoaniline are added to it and it is subsequently stirred at 55° to 60° C. and pH 6 until the condensation reaction has ended (about 3 hours). The batch is subsequently clarified while warm, and the compound according to the invention is isolated by spray-drying.

This gives a red electrolyte-containing powder of the sodium salt of the compound of the formula

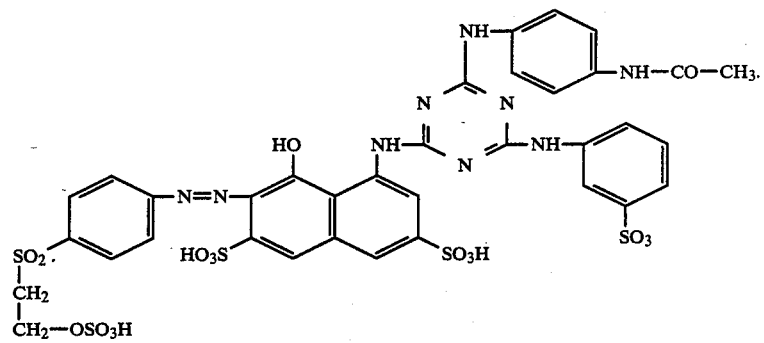

This compound according to the invention has very good fiber-reactive dye properties and produces on cellulose fiber materials by the application and fixing methods customary for fiber-reactive dyes dyeings and prints in deep, bright, bluish red shades which have very good wet-fast properties, such as, in particular, very good wash fastness properties, good wet light fastness properties and in particular a good alkaline perspiration light fastness.

EXAMPLES 4 to 92

In the tabulated examples below, further compounds according to the invention are described in terms of their components conforming to a general formula (A)

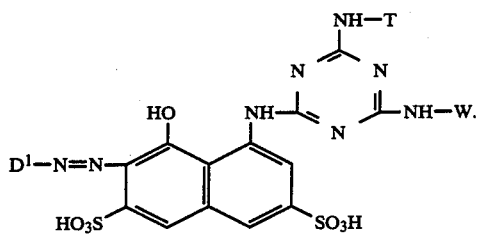

(A)

They can be prepared in a manner according to the invention, for example as described in one of the above Examples, by means of their components visible from the respective tabulated example in conjunction with the formula (A) (i.e. the diazo component $D^1$—$NH_2$, cyanuric chloride or cyanuric fluoride, preferably cyanuric chloride, 1-amino-3,6-disulfo-8-naphthol and the amino compounds conforming to the general formulae $H_2N$-T and $H_2N$-W which are condensable to the triazine radical). They have fiber-reactive dye properties and produce in particular on cellulose fiber materials by the application and fixing methods customary for fiber-reactive dyes strong fast dyeings and prints in the hues indicated for dyeings on cotton in the respective tabulated example.

| | Compound of the formula (A) with | | | |
|---|---|---|---|---|
| Ex. | $D^1$ equal to ... | T equal to ... | W equal to ... | Hue |
| 4 | 2-sulfophenyl | 3-sulfo-4-aminophenyl | 4-(β-sulfato-ethylsulfonyl)-phenyl | bluish red |
| 5 | 2-sulfophenyl | 2,5-disulfo-4-aminophenyl | 4-(β-sulfato-ethylsulfonyl)-phenyl | yellowish red |
| 6 | 2-sulfophenyl | 3-(β-sulfato-ethylsulfonyl)-4-aminophenyl | 4-(β-sulfato-ethylsulfonyl)-phenyl | yellowish red |
| 7 | 2-sulfophenyl | 4-(3'-sulfo-phenylamino)-phenyl | 4-(β-sulfato-ethylsulfonyl)-phenyl | bluish red |
| 8 | 2-sulfophenyl | 3-sulfo-4-(phenylamino)-phenyl | 4-(β-sulfato-ethylsulfonyl)-phenyl | bluish red |
| 9 | 2-sulfophenyl | 3-sulfo-4-(4'-methylphenyl-amino)-phenyl | 4-(β-sulfato-ethylsulfonyl)-phenyl | bluish red |
| 10 | 2-sulfophenyl | 4-methoxyphenyl | 4-(β-sulfato-ethylsulfonyl)-phenyl | bluish red |
| 11 | 2-sulfophenyl | 4-hydroxyphenyl | 4-(β-sulfato-ethylsulfonyl)-phenyl | yellowish red |
| 12 | 2-sulfophenyl | 3-sulfo-4-hydroxyphenyl | 4-(β-sulfato-ethylsulfonyl)-phenyl | yellowish red |
| 13 | 2-sulfophenyl | 4-ureidophenyl | 4-(β-sulfato-ethylsulfonyl)-phenyl | yellowish red |
| 14 | 2-sulfophenyl | 4-aminophenyl | 2,5-dimethoxy-4-(β-sulfato-ethylsulfonyl)-phenyl | bluish red |
| 15 | 2-sulfophenyl | 4-acetylamino-phenyl | 2,5-dimethoxy-4-(β-sulfato-ethylsulfonyl)-phenyl | bluish red |
| 16 | 2-sulfophenyl | 4-formylamino-phenyl | 2,5-dimethoxy-4-(β-sulfato-ethylsulfonyl)-phenyl | bluish red |
| 17 | 2-sulfophenyl | 3-sulfo-4-aminophenyl | 2,5-dimethoxy-4-(β-sulfato-ethylsulfonyl)-phenyl | bluish red |
| 18 | 2-sulfophenyl | 2,5-disulfo-4-aminophenyl | 2,5-dimethoxy-4-(β-sulfato-ethylsulfonyl)-phenyl | bluish red |
| 19 | 2-sulfophenyl | 3-sulfo-4-(phenylamino)-phenyl | 2,5-dimethoxy-4-(β-sulfato-ethylsulfonyl)-phenyl | bluish red |
| 20 | 2-sulfo-phenyl | 3-sulfo-4-(4'-methylphenyl-amino)-phenyl | 2,5-dimethoxy-4-(β-sulfato-ethylsulfonyl)-phenyl | bluish red |
| 21 | 2-sulfo-phenyl | 4-hydroxyphenyl | 2,5-dimethoxy-4-(β-sulfato-ethylsulfonyl)- | bluish red |

-continued

| | Compound of the formula (A) with | | | |
|---|---|---|---|---|
| Ex. | D¹ equal to ... | T equal to ... | W equal to ... | Hue |
| 22 | 2-sulfo-phenyl | 3-sulfo-4-hydroxyphenyl | 2,5-dimethoxy-4-(β-sulfato-ethylsulfonyl)-phenyl | bluish red |
| 23 | 2-sulfo-phenyl | 4-N—(dichloro-s-triazinyl)-aminophenyl | 2,5-dimethoxy-4-(β-sulfato-ethylsulfonyl)-phenyl | bluish red |
| 24 | 2-carboxy-5-sulfophenyl | 4-acetylamino-phenyl | 4-(β-sulfato-ethylsulfonyl)-phenyl | yellowish red |
| 25 | 2-carboxy-5-sulfophenyl | 3-sulfo-4-aminophenyl | 4-(β-sulfato-ethylsulfonyl)-phenyl | yellowish red |
| 26 | 2-carboxy-5-sulfophenyl | 3-sulfo-4-(phenylamino)-phenyl | 4-(β-sulfato-ethylsulfonyl)-phenyl | yellowish red |
| 27 | 2-carboxy-5-sulfophenyl | 3-sulfo-4-(3'-chlorophenyl-amino)-phenyl | 4-(β-sulfato-ethylsulfonyl)-phenyl | yellowish red |
| 28 | 2-carboxy-5-sulfophenyl | 4-hydroxyphenyl | 4-(β-sulfato-ethylsulfonyl)-phenyl | yellowish red |
| 29 | 2-sulfo-4-methylphenyl | 3-sulfo-4-aminophenyl | 4-(β-sulfato-ethylsulfonyl)-phenyl | bluish red |
| 30 | 2-sulfo-4-methylphenyl | 2,5-disulfo-4-aminophenyl | 4-(β-sulfato-ethylsulfonyl)-phenyl | bluish red |
| 31 | 2-sulfo-4-methylphenyl | 3-sulfo-4-(phenylamino)-phenyl | 4-(β-sulfato-ethylsulfonyl)-phenyl | bluish red |
| 32 | 2-sulfo-4-methylphenyl | 4-acetylamino-phenyl | 4-(β-sulfato-ethylsulfonyl)-phenyl | bluish red |
| 33 | 4-chloro-2-sulfo-5-methyl-phenyl | 4-aminophenyl | 4-(β-sulfato-ethylsulfonyl)-phenyl | yellowish red |
| 34 | 4-chloro-2-sulfo-5-methyl-phenyl | 4-acetylamino-phenyl | 4-(β-sulfato-ethylsulfonyl)-phenyl | yellowish red |
| 35 | 4-chloro-2-sulfo-5-methyl-phenyl | 3-sulfo-4-aminophenyl | 4-(β-sulfato-ethylsulfonyl)-phenyl | yellowish red |
| 36 | 4-chloro-2-sulfo-5-methyl-phenyl | 3-sulfo-4-(phenylamino)-phenyl | 4-(β-sulfato-ethylsulfonyl)-phenyl | yellowish red |
| 37 | 4-chloro-2-sulfo-5-methyl-phenyl | 2,5-disulfo-4-aminophenyl | 4-(β-sulfato-ethylsulfonyl)-phenyl | yellowish red |
| 38 | 2,5-disulfo-phenyl | 4-aminophenyl | 4-(β-sulfato-ethylsulfonyl)-phenyl | yellowish red |
| 39 | 2,5-disulfo-phenyl | 4-acetylamino-phenyl | 4-(β-sulfato-ethylsulfonyl)-phenyl | yellowish red |
| 40 | 2,5-disulfo-phenyl | 4-formylamino-phenyl | 4-(β-sulfato-ethylsulfonyl)-phenyl | yellowish red |
| 41 | 2,5-disulfo-phenyl | 4-benzoylamino-phenyl | 4-(β-sulfato-ethylsulfonyl)-phenyl | yellowish red |
| 42 | 2,5-disulfo-phenyl | 3-(β-sulfato-ethylsulfonyl)-4-aminophenyl | 4-(β-sulfato-ethylsulfonyl)-phenyl | yellowish red |
| 43 | 2,5-disulfo-phenyl | 3-sulfo-4-acet-ylaminophenyl | 4-(β-sulfato-ethylsulfonyl)-phenyl | yellowish red |
| 44 | 2,5-disulfo-phenyl | 4-(phenyl-amino)-phenyl | 4-(β-sulfato-ethylsulfonyl)-phenyl | red |
| 45 | 2,5-disulfo-phenyl | 3-sulfo-4-(phenylamino)-phenyl | 4-(β-sulfato-ethylsulfonyl)-phenyl | red |
| 46 | 2,5-disulfo-phenyl | 2,4-dimethoxy-phenyl | 4-(β-sulfato-ethylsulfonyl)-phenyl | bluish red |
| 47 | 2,5-disulfo-phenyl | 4-hydroxyphenyl | 4-(β-sulfato-ethylsulfonyl)- | yellowish red |

-continued

| | Compound of the formula (A) with | | | |
|---|---|---|---|---|
| Ex. | D¹ equal to ... | T equal to ... | W equal to ... | Hue |
| 48 | 2,5-disulfo-phenyl | 4-(phenoxy)-phenyl | phenyl 4-(β-sulfato-ethylsulfonyl)-phenyl | yellow-ish red |
| 49 | 2,5-disulfo-phenyl | 3-(β-sulfato-ethylsulfonyl)-4-hydroxyphenyl | 4-(β-sulfato-ethylsulfonyl)-phenyl | yellow-ish red |
| 50 | 2,5-disulfo-phenyl | 3-sulfo-4-(4'-aminophenyl)-phenyl | 4-(β-sulfato-ethylsulfonyl)-phenyl | yellow-ish red |
| 51 | 1-sulfonaphth-2-yl | 3-sulfo-4-aminophenyl | 4-(β-sulfato-ethylsulfonyl)-phenyl | bluish red |
| 52 | 1-sulfonaphth-2-yl | 2,5-disulfo-4-aminophenyl | 4-(β-sulfato-ethylsulfonyl)-phenyl) | bluish red |
| 53 | 1-sulfonaphth-2-yl | 2-sulfo-4-acet-ylaminophenyl | 4-(β-sulfato-ethylsulfonyl)-phenyl) | bluish red |
| 54 | 1-sulfonaphth-2-yl | 3-sulfo-4-(phenylamino)-phenyl | 4-(β-sulfato-ethylsulfonyl)-phenyl) | bluish red |
| 55 | 1-sulfonaphth-2-yl | 3-sulfo-4-hydroxyphenyl | 4-(β-sulfato-ethylsulfonyl)-phenyl) | bluish red |
| 56 | 1,5-disulfo-naphth-2-yl | 4-aminophenyl | 4-(β-sulfato-ethylsulfonyl)-phenyl) | bluish red |
| 57 | 1,5-disulfo-naphth-2-yl | 4-acetylamino-phenyl | 4-(β-sulfato-ethylsulfonyl)-phenyl) | bluish red |
| 58 | 1,5-disulfo-naphth-2-yl | 4-formylamino-phenyl | 4-(β-sulfato-ethylsulfonyl)-phenyl) | bluish red |
| 59 | 1,5-disulfo-naphth-2-yl | 4-benzoylamino-phenyl | 4-(β-sulfato-ethylsulfonyl)-phenyl) | bluish red |
| 60 | 1,5-disulfo-naphth-2-yl | 3-sulfo-4-aminophenyl | 4-(β-sulfato-ethylsulfonyl)-phenyl) | bluish red |
| 61 | 1,5-disulfo-naphth-2-yl | 2-sulfo-4-acet-ylaminophenyl | 4-(β-sulfato-ethylsulfonyl)-phenyl) | bluish red |
| 62 | 1,5-disulfo-naphth-2-yl | 4-(phenyl-amino)-phenyl | 4-(β-sulfato-ethylsulfonyl)-phenyl) | bluish red |
| 63 | 1,5-disulfo-naphth-2-yl | 3-sulfo-4-(phenylamino)-phenyl | 4-(β-sulfato-ethylsulfonyl)-phenyl) | bluish red |
| 64 | 1,5-disulfo-naphth-2-yl | 4-hydroxyphenyl | 4-(β-sulfato-ethylsulfonyl)-phenyl) | bluish red |
| 65 | 1,5-disulfo-naphth-2-yl | 4-methoxyphenyl | 4-(β-sulfato-ethylsulfonyl)-phenyl) | bluish red |
| 66 | 1,5,7-trisulfo-naphth-2-yl | 4-acetylamino-phenyl | 4-(β-sulfato-ethylsulfonyl)-phenyl) | bluish red |
| 67 | 1,5,7-trisulfo-naphth-2-yl | 4-aminophenyl | 4-(β-sulfato-ethylsulfonyl)-phenyl) | bluish red |
| 68 | 1,5,7-trisulfo-naphth-2-yl | 4-(phenyl-amino)-phenyl | 4-(β-sulfato-ethylsulfonyl)-phenyl) | bluish red |
| 69 | 2-sulfophenyl | 4-aminophenyl | 4-(β-sulfato-ethylsulfonyl)-phenyl | yellow-ish red |
| 70 | 2-sulfophenyl | 4-formylamino-phenyl | 4-(β-sulfato-ethylsulfonyl)-phenyl | yellow-ish red |
| 71 | 1,5-disulfo-naphth-2-yl | 4-acetylamino-phenyl | 3-(β-sulfato-ethylsulfonyl)-phenyl | bluish red |
| 72 | 2-sulfophenyl | 3-sulfo-4-(phenylamino)-phenyl | 3-(β-sulfato-ethylsulfonyl)-phenyl | bluish red |
| 73 | 2-sulfophenyl | 3-sulfo-4-aminophenyl | 3-(β-sulfato-ethylsulfonyl)-phenyl | bluish red |
| 74 | 2,5-disulfo- | 3-sulfo-4- | 3-(β-sulfato- | yellow- |

| Ex. | D¹ equal to... | T equal to... | W equal to... | Hue |
|---|---|---|---|---|
|  | phenyl | aminophenyl | ethylsulfonyl)-phenyl | ish red |
| 75 | 2,5-disulfo-phenyl | 3-sulfo-4-(phenylamino)-phenyl | 3-(β-sulfato-ethylsulfonyl)-phenyl | yellow-ish red |
| 76 | 2,5-disulfo-phenyl | 4-N—(3'-sulfo-phenyl)-amino-phenyl | 3-(β-sulfato-ethylsulfonyl)-phenyl | yellow-ish red |
| 77 | 2,5-disulfo-phenyl | 3-sulfo-4-hydroxyphenyl | 3-(β-sulfato-ethylsulfonyl)-phenyl | yellow-ish red |
| 78 | 3-sulfo-4-methylphenyl | 3-sulfo-4-hydroxyphenyl | 3-(β-sulfato-ethylsulfonyl)-phenyl | yellow-ish red |
| 79 | 3-sulfo-4-methylphenyl | 3-sulfo-4-(phenylamino)-phenyl | 3-(β-sulfato-ethylsulfonyl)-phenyl | bluish red |
| 80 | 3-sulfo-4-methylphenyl | 3-sulfo-4-aminophenyl | 3-(β-sulfato-ethylsulfonyl)-phenyl | bluish red |
| 81 | 4-(β-sulfato-ethylsulfonyl)-phenyl | 4-acetylamino-phenyl | 2,5-disulfo-phenyl | bluish red |
| 82 | 4-(β-sulfato-ethylsulfonyl)-phenyl | 3-sulfo-4-(phenylamino)-phenyl | 3-sulfophenyl | bluish red |
| 83 | 4-(β-sulfato-ethylsulfonyl)-phenyl | 4-hydroxyphenyl | 3-sulfophenyl | bluish-red |
| 84 | 4-(β-sulfato-ethylsulfonyl)-phenyl | 3-sulfo-4-(phenylamino)-phenyl | 4-(β-sulfato-ethylsulfonyl)-phenyl | bluish red |
| 85 | 4-(β-sulfato-ethylsulfonyl)-phenyl | 3-sulfo-4-aminophenyl | 4-(β-sulfato-ethylsulfonyl)-phenyl | bluish red |
| 86 | 3-(β-sulfato-ethylsulfonyl)-phenyl | 3-sulfo-4-aminophenyl | 4-(β-sulfato-ethylsulfonyl)-phenyl | bluish red |
| 87 | 3-(β-sulfato-ethylsulfonyl)-phenyl | 3-sulfo-4-(phenylamino)-phenyl | 4-(β-sulfato-ethylsulfonyl)-phenyl | bluish red |
| 88 | 3-(β-sulfato-ethylsulfonyl)-phenyl | 3-sulfo-4-(phenylamino)-phenyl | 3-(β-sulfato-ethylsulfonyl)-phenyl | bluish red |
| 89 | 3-(β-sulfato-ethylsulfonyl)-phenyl | 3-sulfo-4-(phenylamino)-phenyl | 3-sulfophenyl | bluish red |
| 90 | 3-(β-sulfato-ethylsulfonyl)-phenyl | 4-acetylamino-phenyl | 3-sulfophenyl | bluish red |
| 91 | 3-(β-sulfato-ethylsulfonyl)-phenyl | 4-acetylamino-phenyl | 2,5-disulfo-phenyl | bluish red |
| 92 | 2-sulfo-5-(β-sulfatoethyl-sulfonyl)-phenyl | 4-acetylamino-phenyl | 3-sulfophenyl | bluish red |

EXAMPLES 93 to 104

In the tabulated examples below, further compounds according to the invention are described by means of their components conforming to a general formula (B)

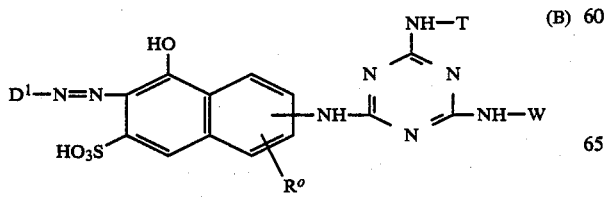

(B)

with R° equal to a hydrogen atom or a sulfo group. They can be prepared in a manner according to the invention, for example as described in one of the above worked examples, by means of their components visible from the respective tabulated example in conjunction with the formula (B) (the diazo component D¹-NH₂, cyanuric chloride or cyanuric fluoride, preferably cyanuric chloride, aminonaphtholsulfonic acid and the amino compounds conforming to the general formulae H₂N-T and H₂N-W which are condensable to the triazine radical). They have fiber-reactive dye properties and produce in particular on cellulose fiber materials by the application and fixing methods customary for fiber-reactive dyes strong fast dyeings and prints in the hues indicated for dyeings on cotton in the respective tabulated example.

| Ex. | D¹ equal to... | Compound of the formula (B) with Aminonaphthol-sulfonic acid | T equal to... | W equal to... | Hue |
|---|---|---|---|---|---|
| 93 | 1,5-disulfonaphth-2-yl | 1-amino-4,6-disulfo-8-naphthol | 4-acetylamino-phenyl | 3-($\beta$-sulfatoethyl-sulfonyl)-phenyl | yellow-ish red |
| 94 | 2-sulfophenyl | 1-amino-4,6-disulfo-8-naphthol | 4-acetylamino-phenyl | 3-($\beta$-sulfatoethyl-sulfonyl)-phenyl | yellow-ish red |
| 95 | 2-sulfophenyl | 1-amino-4,6-disulfo-8-naphthol | 3-sulfo-(phenyl-amino)-phenyl | 3-($\beta$-sulfatoethyl-sulfonyl)-phenyl | yellow-ish red |
| 96 | 2,5-disulfophenyl | 3-amino-6-sulfo-8-naphthol | 3-sulfo-4-amino-phenyl | 3-($\beta$-sulfatoethyl-sulfonyl)-phenyl | golden yellow |
| 97 | 2,5-disulfophenyl | 3-amino-6-sulfo-8-naphthol | 3-sulfo-4-(phenyl-amino)-phenyl | 3-($\beta$-sulfatoethyl-sulfonyl)-phenyl | golden yellow |
| 98 | 2,5-disulfophenyl | 3-amino-6-sulfo-8-naphthol | 2,5-disulfo-4-aminophenyl | 3-($\beta$-sulfatoethyl-sulfonyl)-phenyl | golden yellow |
| 99 | 3-sulfomethoxy-phenyl | 3-amino-6-sulfo-8-naphthol | 2,5-disulfo-4-aminophenyl | 3-($\beta$-sulfatoethyl-sulfonyl)-phenyl | scarlet |
| 100 | 3-sulfomethoxy-phenyl | 3-amino-6-sulfo-8-naphthol | 3-sulfo-4-(phenyl-amino)-phenyl | 3-($\beta$-sulfatoethyl-sulfonyl)-phenyl | scarlet |
| 101 | 3-sulfomethoxy-phenyl | 3-amino-6-sulfo-8-naphthol | 3-sulfo-4-(phenyl-amino)-phenyl | 4-($\beta$-sulfatoethyl-sulfonyl)-phenyl | scarlet |
| 102 | 4-($\beta$-sulfatoethyl-sulfonyl)-phenyl | 1-amino-4,6-disulfo-8-naphthol | 4-acetylaminophenyl | 3-sulfophenyl | bluish red |
| 103 | 4-($\beta$-sulfatoethyl-sulfonyl)-phenyl | 1-amino-4,6-disulfo-8-naphthol | 3-sulfo-4-(phenyl-amino)-phenyl | 3-sulfophenyl | bluish red |
| 104 | 4-($\beta$sulfatoethyl-sulfonyl)-phenyl | 1-amino-4,6-disulfo-8-naphthol | 3-sulfo-4-(phenyl-amino)-phenyl | 4-($\beta$-sulfatoethyl-sulfonyl)-phenyl | bluish red |

EXAMPLES 105 to 108

In the tabulated examples below, further compounds according to the invention are described in terms of their components conforming to the general formula and produce in particular on cellulose fiber materials by the application and fixing methods customary for fiber-reactive dyes strong fast dyeings and prints in the hues indicated for dyeings on cotton in the respective tabulated example.

| Ex. | D¹ equal to... | Compound of the formula (C) with Aminonaphthol-sulfonic acid | T equal to... | W equal to... | Hue |
|---|---|---|---|---|---|
| 105 | 2-sulfophenyl | 1-amino-3,6-disulfo-8-naphthol | 4-acetylaminophenyl | $\beta$-($\beta'$-chloroethyl-sulfonyl)-ethyl | yellow-ish red |
| 106 | 1,5-disulfonaphth-2-yl | 1-amino-3,6-disulfo-8-naphthol | 4-acetylaminophenyl | $\beta$-($\beta'$-chloroethyl-sulfonyl)-ethyl | bluish red |
| 107 | 2-sulfophenyl | 1-amino-3,6-disulfo-8-naphthol | 3-sulfo-4-(phenyl-amino)-phenyl | $\beta$-($\beta'$-chloroethyl-sulfonyl)-ethyl | yellow-ish red |
| 108 | 4-methyl-2-sulfophenyl | 1-amino-3,6-disulfo-8-naphthol | 3-sulfo-4-(phenyl-amino)-phenyl | $\beta$-($\beta'$-chloroethyl-sulfonyl)-ethyl | yellow-ish red |

(C)

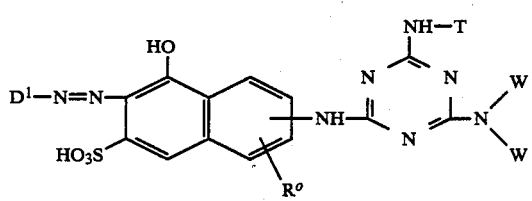

with R° equal to a hydrogen atom or a sulfo group. They can be prepared in a manner according to the invention, for example as described in one of the above worked examples, by means of their components visible from the respective tabulated example in conjunction with the formula (C) (the diazo component D¹-NH₂, cyanuric chloride or cyanuric fluoride, preferably cyanuric chloride, aminonaphtholsulfonic acid and the amino compounds conforming to the general formulae H₂N-T and HN(W)₂ which are condensable to the triazine radical). They have fiber-reactive dye properties

EXAMPLE 109

To a mixture of 194 parts of cyanuric chloride in 800 parts of water and 800 parts of ice is gradually added a neutral solution of 319 parts of 1-amino-3,6-disulfo-8-naphthol in 500 parts of water. This is followed by stirring at a temperature of 0° to 5° C. and a pH value of 3.5 for about 60 minutes, 198 parts of 3-sulfo-1,4-diaminobenzene are then added, and a second condensation reaction is carried out at a temperature of 20° to 35° C. and a pH value of 5.5.

To this batch is then added a diazonium salt suspension which is prepared in conventional manner by diazotizing a sulfuric acid solution of 289 parts of 4-($\beta$-sulfatoethylsulfonyl)-aniline in about 1200 parts of water at 0° to 5° C. A coupling reaction is effected at a pH value between 6.0 and 6.5. The batch is then heated to 50° C., clarified and spray-dried.

This gives a red, electrolyte-containing powder of the sodium salt of the compound of the formula

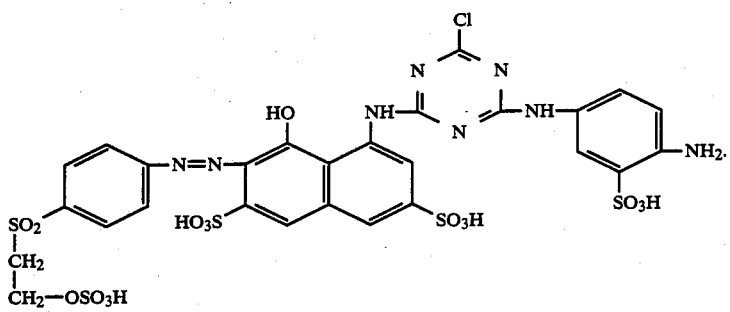

This azo compound according to the invention displays in aqueous solution in the visible range an absorption peak at 517 nm; it has very good fiber-reactive dye properties and produces on cellulose fiber materials good dyeings and prints having a red shade and good in-use fastness properties, of which in particular the good wet fastness and alkaline perspiration fastness are noteworthy.

EXAMPLES 110 to 126

In the tabulated examples below, further compounds according to the invention are described in terms of their components in accordance with a general formula (D)

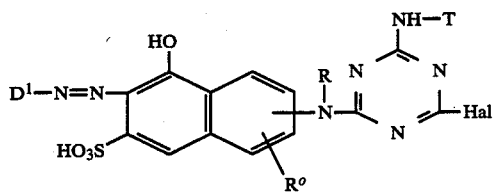

with R° equal to a hydrogen atom or a sulfo group and R equal to a hydrogen atom or a methyl group. They can be prepared in a manner according to the invention, for example as described in Example 109 by means of their components visible from the respective tabulated example in conjuction with the formula (D) (the diazo component $D^1$-$NH_2$, cyanuric chloride or cyanuric fluoride, preferably cyanuric chloride, methylamino- or amino-naphtholsulfonic acid and the amino compound conforming to the general formula $H_2N$-T which is condensable to the triazine radical). They have fiber-reactive dye properties and produce in particular on cellulose fiber materials by the application and fixing methods customary for fiber-reactive dyes strong fast dyeings and prints in the hues indicated for dyeings on cotton in the respective tabulated example.

| | | Compound of the formula (D) with | | | |
|---|---|---|---|---|---|
| Ex. | $D^1$ equal to ... | Aminonaphthol-sulfonic acid | T equal to ... | Hal equal to ... | Hue |
| 110 | 4-(β-sulfatoethyl-sulfonyl)-phenyl | 1-amino-3,6-di-sulfo-8-naphthol | 4-acetylaminophenyl | chlorine | red |
| 111 | 4-(β-sulfatoethyl-sulfonyl)-phenyl | 1-amino-3,6-di-sulfo-8-naphthol | 3-sulfo-4-(phenyl-amino)-phenyl | chlorine | red |
| 112 | 3-(β-sulfatoethyl-sulfonyl)-phenyl | 1-amino-3,6-di-sulfo-8-naphthol | 3-sulfo-4-(phenyl-amino)-phenyl | chlorine | red |
| 113 | 3-(β-sulfatoethyl-sulfonyl)-phenyl | 1-amino-3,6-di-sulfo-8-naphthol | 3-sulfo-4-amino phenyl | chlorine | red |
| 114 | 3-(β-sulfatoethyl-sulfonyl)-phenyl | 1-amino-3,6-di-sulfo-8-naphthol | 4-acetylaminophenyl | chlorine | red |
| 115 | 2-sulfo-5-(β-sulfatoethylsulfonyl)-phenyl | 1-amino-3,6-di-sulfo-8-naphthol | 4-acetylaminophenyl | chlorine | red |
| 116 | 4-(β-sulfatoethyl-sulfonyl)-phenyl | 1-amino-4,6-di-sulfo-8-naphthol | 4-acetylaminophenyl | chlorine | yellow-ish red |
| 117 | 4-(β-sulfatoethyl-sulfonyl)-phenyl | 1-amino-4,6-di-sulfo-8-naphthol | 3-sulfo-4-(phenyl-amino)-phenyl | chlorine | yellow-ish red |
| 118 | 4-(β-sulfatoethyl-sulfonyl)-phenyl | 6-amino-3-sulfo-1-naphthol | 3-sulfo-4-(phenyl-amino)-phenyl | chlorine | yellow-ish red |
| 119 | 4-(β-sulfatoethyl-sulfonyl)-phenyl | 6-N—methylamino-3-sulfo-1-naphthol | 3-sulfo-4-(phenyl-amino)-phenyl | chlorine | yellow-ish red |
| 120 | 4-(β-sulfatoethyl-sulfonyl)-phenyl | 7-amino-3-sulfo-1-naphthol | 3-sulfo-4-(phenyl-amino)-phenyl | chlorine | scarlet |
| 121 | 4-(β-sulfatoethyl-sulfonyl)-phenyl | 7-N—methylamino-3-sulfo-1-naphthol | 3-sulfo-4-(phenyl-amino)-phenyl | chlorine | scarlet |
| 122 | 3-(β-sulfatoethyl-sulfonyl)-phenyl | 6-amino-3-sulfo-1-naphthol | 3-sulfo-4-(phenyl-amino)-phenyl | chlorine | yellow-ish red |
| 123 | 3-(β-sulfatoethyl-sulfonyl)-phenyl | 7-amino-3-sulfo-1-naphthol | 3-sulfo-4-(phenyl-amino)-phenyl | chlorine | scarlet |
| 124 | 4-(β-sulfatoethyl-sulfonyl)-phenyl | 1-amino-3,6-di-sulfo-8-naphthol | 4-acetylamino-phenyl | fluorine | red |

| Ex. | $D^1$ equal to ... | Aminonaphthol-sulfonic acid | T equal to ... | Hal equal to ... | Hue |
|---|---|---|---|---|---|
| 125 | 4-(β-sulfatoethyl-sulfonyl)-phenyl | 1-amino-3,6-di-sulfo-8-naphthol | 3-sulfo-4-(phenyl-amino)-phenyl | fluorine | red |
| 126 | 3-(β-sulfatoethyl-sulfonyl)-phenyl | 1-amino-3,6-di-sulfo-8-naphthol | 3-sulfo-4-(phenyl-amino)-phenyl | fluorine | red |

We claim:

1. A compound of the formula

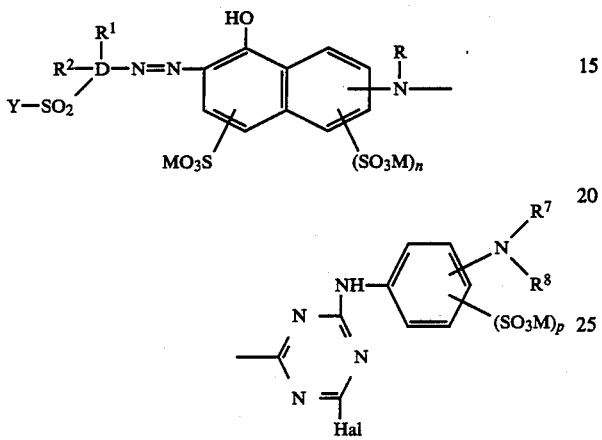

in which:

D is a benzene or naphthalene ring;

$R^1$ is hydrogen, alkyl of 1 to 4 carbon atoms, alkoxy of 1 to 4 carbon atoms, sulfo or carboxy;

$R^2$ is hydrogen, alkyl of 1 to 4 carbon atoms, alkoxy of 1 to 4 carbon atoms, sulfo, carboxy, phenyl or phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine, or is 1- or 2-naphthyl, or is 1- or 2-naphthyl substituted by 1, 2 or 3 sulfo, or is hydroxy, nitro or halogen;

R is hydrogen, alkyl of 1 to 4 carbon atoms or alkyl of 1 to 4 carbon atoms substituted by 1 or 2 substituents selected from the group consisting of: alkoxy of 1 to 4 carbon atoms; sulfocarboxy; hydroxy; sulfato; phenyl; phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine; 1- or 2-naphthyl; and 1- or 2-naphthyl substituted by 1, 2 or 3 sulfo;

$R^7$ is hydrogen, or is alkyl of 1 to 4 carbon atoms unsubstituted or substituted by 1 or 2 substituents selected from the group consisting of: alkoxy of 1 to 4 carbon atoms; sulfo; carboxy; hydroxy; sulfato; phosphato; phenyl; naphthyl; phenyl substituted by 1 or 2 substituents selected from the group consisting of alkyl of 1 to 4 carbon atoms, hydroxy, nitro, carboxy, sulfo and chlorine; and naphthyl substituted by 1, 2 or 3 sulfo; or $R^7$ is alkenyl of 2 to 4 carbon atoms or cyclopentyl or cyclohexyl, or cyclopentyl or cyclohexyl substituted by 1, 2 or 3 methyl, and $R^8$ is hydrogen, or is alkyl of 1 to 4 carbon atoms unsubstituted or substituted by 1 or 2 substituents selected from the group consisting of: alkoxy of 1 to 4 carbon atoms; sulfo; carboxy; hydroxy; sulfato; phosphato; phenyl; naphthyl; phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine; and naphthyl substituted by 1, 2 or 3 sulfo; or $R^8$ is alkenyl of 2 to 4 carbon atoms or is phenyl or naphthyl, or is phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine, or is naphthyl substituted by 1, 2 or 3 sulfo, or $R^8$ is cyano or a group of the formula

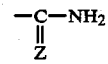

in which Z is oxygen, sulfur, or =N—H, or $R^8$ is amino or amino monosubstituted or disubstituted by substituents selected from: alkyl of 1 to 4 carbon atoms; phenyl; naphthyl; phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine; and naphthyl substituted by 1, 2 or 3 sulfo; or $R^8$ is a group of the formula

in which

W is alkyl of 1 to 4 carbon atoms unsubstituted or subtituted by 1 or 2 substitutents selected from group consisting of: alkoxy of 1 to 4 carbon atoms; sulfo; carboxy; hydroxy; sulfato; phosphato; phenyl; naphthyl; phenyl substituted by 1 or 2 substituents selected from the group consisting of alkyl of 1 to 4 carbon atoms, alkoxy of 1 to 4 carbon atoms, hydroxy, nitro, carboxy, sulfo and chlorine; and naphthyl substituted by 1, 2 or 3 sulfo; or $R^8$ is alkoxy of 1 to 4 carbon atoms unsubstitued or substituted by hydroxy, alkoxy of 1 to 4 carbon atoms or alkoxyalkoxy of 1 to 4 carbon atoms in each of the alkyl moieties; or $R^7$ and $R^8$ together with the nitrogen are morpholino, piperidino or piperazino;

M is hydrogen or an alkali metal or alkaline earth metal;

n is zero or 1;

p is zero, 1 or 2;

Y is β-thiosulfatoethyl, β-phosphatoethyl, β-chloroethyl, vinyl or β-sulfatoethyl;

Hal is chlorine or fluorine.

2. A compound according to claim 1, wherein Hal is chlorine.

3. A compound according to claim 1, wherein M is sodium, potassium or lithium.

4. A compound according to claim 1, in which $R^7$ and $R^8$ both are hydrogen and p is 1.

5. A compound according to claim 1, wherein Y is β-sulfatoethyl.

6. A compound according to claim 1, wherein $R^1$ and $R^2$ both are hydrogen.

* * * * *

UNITED STATES PATENT AND TRADEMARK OFFICE
CERTIFICATE OF CORRECTION

PATENT NO. : 4,902,786

DATED : February 20, 1990

INVENTOR(S) : Hartmut Springer, Michael Kunze and Marcos Segal

It is certified that error appears in the above-identified patent and that said Letters Patent is hereby corrected as shown below:

In claim 1, at column 37, line 46,

"sulfocarboxy;" should read --sulfo; carboxy;--.

Signed and Sealed this

Tenth Day of September, 1991

Attest:

HARRY F. MANBECK, JR.

*Attesting Officer*     *Commissioner of Patents and Trademarks*